United States Patent
Leschka et al.

(10) Patent No.: US 11,039,243 B2
(45) Date of Patent: Jun. 15, 2021

(54) APPARATUS FOR PROVIDING AN AUDIO SIGNAL FOR REPRODUCTION BY A SOUND TRANSDUCER, SYSTEM, METHOD AND COMPUTER PROGRAM

(71) Applicant: Fraunhofer-Gesellschaft zur Foerderung der angewandten Forschung e.V., Munich (DE)

(72) Inventors: Florian Leschka, Roettenbach (DE); Felix Fleischmann, Stein (DE); Jan Plogsties, Fuerth (DE); Andreas Silzle, Buckenhof (DE)

(73) Assignee: FRAUNHOFER-GESELLSCHAFT ZUR FOFRDFRTTNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 15/254,217

(22) Filed: Sep. 1, 2016

(65) Prior Publication Data
US 2016/0373860 A1  Dec. 22, 2016

Related U.S. Application Data

(60) Division of application No. 14/466,003, filed on Aug. 22, 2014, now abandoned, which is a continuation of
(Continued)

(51) Int. Cl.
*H04R 3/04* (2006.01)
*G06F 16/683* (2019.01)
(Continued)

(52) U.S. Cl.
CPC .............. *H04R 3/04* (2013.01); *G06F 3/165* (2013.01); *G06F 16/683* (2019.01); *H03G 5/005* (2013.01);
(Continued)

(58) Field of Classification Search
None
See application file for complete search history.

(56) References Cited

U.S. PATENT DOCUMENTS 6,999,826 B1 * 2/2006 Zhou ............... H03G 5/005
381/103
8,473,083 B1 * 6/2013 Emigh ............. H03G 5/04
700/94

(Continued)

FOREIGN PATENT DOCUMENTS

JP    2009-130643 A    6/2009
RU    2 106 075 C1     2/1998
(Continued)

OTHER PUBLICATIONS

Leschka et al., "Apparatus for Providing an Audio Signal for Reproduction by a Sound Transducer, System, Method and Computer Program", U.S. Appl. No. 14/466,003, filed Aug. 22, 2014.
(Continued)

*Primary Examiner* — Kenny H Truong
(74) *Attorney, Agent, or Firm* — Keating & Bennett, L.L.P

(57) ABSTRACT

An apparatus for processing an audio signal for reproduction by a sound transducer includes an equalization parameter determinator for determining a set of equalization parameters and an equalizer configured to equalize an input audio signal, to obtain an equalized audio signal. Different concepts for the determination of the set of equalization parameters include an image recognition, an evaluation of an identification signal which is provided by the sound transducer via an audio connection, and a measurement of the impedance of the sound transducer over frequency. Also, an upload functionality and a download functionality are provided.

5 Claims, 15 Drawing Sheets

Related U.S. Application Data application No. PCT/EP2013/053743, filed on Feb. 25, 2013.

(60) Provisional application No. 61/602,767, filed on Feb. 24, 2012.

(51) Int. Cl.
    *H04S 7/00*     (2006.01)
    *H03G 5/16*     (2006.01)
    *H03G 5/00*     (2006.01)
    *H04R 1/10*     (2006.01)
    *G06F 3/16*     (2006.01)

(52) U.S. Cl.
    CPC ........... *H03G 5/165* (2013.01); *H04R 1/1091* (2013.01); *H04S 7/308* (2013.01); *H04R 2420/05* (2013.01); *H04S 7/307* (2013.01)

(56) References Cited

U.S. PATENT DOCUMENTS

| | | | | |
|---|---|---|---|---|
| 2006/0045294 A1* | 3/2006 | Smyth | ............... | H04S 7/304 |
| | | | | 381/309 |
| 2006/0104453 A1 | 5/2006 | Lee et al. | | |
| 2007/0078546 A1 | 4/2007 | Hsieh et al. | | |
| 2009/0024662 A1* | 1/2009 | Park | ............... | G11B 20/10 |
| 2009/0047993 A1 | 2/2009 | Vasa | | |
| 2009/0074207 A1 | 3/2009 | Kang | | |
| 2009/0147134 A1 | 6/2009 | Iwamatsu | | |
| 2009/0274312 A1 | 11/2009 | Howard et al. | | |
| 2010/0111315 A1 | 5/2010 | Kroman | | |
| 2011/0002471 A1 | 1/2011 | Wihardja et al. | | |
| 2012/0096125 A1* | 4/2012 | Kallai | ............... | H03G 5/005 |
| | | | | 709/219 |

FOREIGN PATENT DOCUMENTS

| | | | | |
|---|---|---|---|---|
| WO | 97/36458 A1 | 10/1997 | | |
| WO | WO 2007139293 A1 * | 12/2007 | ............... | H04R 3/04 |
| WO | 2009/134537 A2 | 11/2009 | | |
| WO | 2010/138311 A1 | 12/2010 | | |

OTHER PUBLICATIONS

Official Communication issued in Russian Patent Application No. 2014138419, dated Mar. 7, 2017.

\* cited by examiner examples of acoustical (left) vs. electrical impedance (right) responses for 2 different types of headphones: intra-concha (upper) and circumaural (lower)

| electrical impedance | intra-concha type | circumaural type |
|---|---|---|
| magnitude: mean value, DC value | low (~20 Ohm) | high (~250-300 Ohm) |
| deviation in magnitude and phase over frequ. | low (magnitude <2 Ohm, phase ~10°) | high (magnitude ~130 Ohm, phase ~35°) |
| main resonance frequency | high (~6 kHz) | low (~100 Hz) | differences in the impedance response of two different types of headphones

FIG 4B

LifeVibes sound enhancement for headphones 10-band EQ in Winamp Media Player engage algorithm with headphone selection Nubert ATM device

_US 11,039,243 B2_

APPARATUS FOR PROVIDING AN AUDIO SIGNAL FOR REPRODUCTION BY A SOUND TRANSDUCER, SYSTEM, METHOD AND COMPUTER PROGRAM

CROSS-REFERENCE TO RELATED APPLICATIONS

This application is a division of U.S. application Ser. No. 14/466,003, filed Aug. 22, 2014, which is incorporated herein by reference in its entirety, U.S. application Ser. No. 14/466,003 being a continuation of copending International Application No. PCT/EP2013/053743, filed Feb. 25, 2013, which is incorporated herein by reference in its entirety, and additionally claims priority from U.S. Application No. 61/602,767, filed Feb. 24, 2012, which is also incorporated herein by reference in its entirety.

Some embodiments according to the invention are related to apparatuses for processing an audio signal for reproduction by a sound transducer. Some embodiments are related to a system comprising an apparatus for processing an audio signal for reproduction by a sound transducer. Some embodiments are related to methods for processing an audio signal for reproduction by a sound transducer. Some embodiments are related to a computer program.

An embodiment according to the invention is related to a downloadable headphone equalization.

BACKGROUND OF THE INVENTION

Sound transducers like, for example, headphones or loudspeakers, are widely used for presenting audio signals to listeners. In some cases, the sound transducers are sold together with the equipment providing the audio signals to be presented by said sound transducers. However, in many cases, the sound transducers are bought separately by the customers, which often results in a degradation of the audio quality.

In the following, some problems will be outlined taking reference to headphones, which are one possible example of a sound transducer.

Firstly, some general characteristics of headphones will be described. There are different types of headphones used in consumer and professional audio: insert ear-phones (intra-canal), ear-buds (intra-concha), on-ear (supra-aural) and over-the-ear (circum-aural). In mobile communications, headphones are often combined with microphones in one device in order to do hands-free voice calls. For simplicity, these "headsets" will also be referred to as headphones (or sound transducers) in this document.

Headphones are produced using various technologies and materials. These differences lead to different sound characteristics. This is mainly due to the alternating frequency response produced by different headphones (see FIG. 8, which shows a graphic representation of a frequency response of different headphones, and also reference [1]). For example, in the graphic representation 800 according to FIG. 8, an abscissa 810 describes a frequency (in the unit of Hertz) in a logarithmic manner. An ordinate 820 describes a level (or relative level) in the unit of decibels in a logarithmic manner. As can be seen, a curve 830 describes a so-called "diffuse-field" frequency response according to international standard ISO-11904-1. A second curve 832 describes a frequency response of a "high-quality" headphone. A third curve 834 describes a frequency response of a "low-cost" headphone. As can be seen, the "high-quality" headphone comprises a frequency response, which approximates the "diffuse-field" frequency response better than the frequency response of the "low-quality" headphone.

Moreover, it should be noted that the frequency response of a headphone is an important component of its perceived quality (see, for example, reference [2]).

Ideally, the headphones should be capable of providing a frequency response that follows a defined target curve, for example, so-called "diffuse-field equalization". For details, reference is made, for example, to reference [3]. In many cases, headphones that have a frequency response which strongly differs from an ideal frequency response, are judged to have a bad audio quality.

The frequency response of a headphone can be identified by measuring on a defined coupler (see, for example, reference [4]). A frequency response describes how much sound pressure is produced in the ear canal when a specific level of electric voltage is fed to the headphones. The level of sound pressure is frequency dependent.

Measuring these frequency responses of headphones is quite challenging. A dummy head equipped with ear-simulators or an acoustic coupler, special audio measurement hardware and software, and appropriate know-how is mandatory, in many cases, for proper results. Hence, measuring frequency responses of headphones should be done by professionals and not by consumers or end users.

In the following, filters for headphones will be described. The audio quality of headphones can be significantly improved. Therefore, it is recommendable to preprocess (for example, "equalize") the signal that is later fed to the headphones. This may, for example, be done by filters that fit to the frequency response of the attached headphones (wherein the filtering can also be designated as "equalizing"). For details, reference is made to reference [5]. These filters, for example, can be designed to compensate for the imperfect frequency response, which is referred to as (headphone) equalization. Hence, the audio quality of these headphones may be raised.

Currently, headphones can be attached to almost all consumer media devices, like, for example, TV sets, game consoles, AV receivers, personal music players, smartphones, etc. In such devices, filters can be implemented in analog or digital fashion.

In some cases, the headphones are sold together with a device. However, due to a standardized interface, any headphone can be attached to any device. However, this compatibility often comes at the prices of a poor matching between the device and the headphones.

Some manufacturers of headphones try to identify the headphone attached to the device in order to select the filters. For example, this is possible for a digital connection via Bluetooth. Alternatively, RFID can be used to identify the headphone (see, for example, reference [6]).

For an analog connection via headphone jack, it is possible to measure the impedance of headphones. This is done for power control of the headphone amplifier (see, for example, reference [7]). However, an identification of the headphone has not been possible by such simple means.

In the following, different concepts for a sound enhancement for headphones will be described.

Audio signal processing for enhancing the quality is done in many applications referred to as sound enhancement, equalizer, virtualizer, etc. Some of the algorithms take into account the specific situation of listening with headphones. They provide headphone effects, like, for example, bass boost or 3D effects. As an example, reference is made to FIG. 9, which shows a screenshot of the so-called "Life Vibes" sound enhancement for headphones. However, these concepts do not take into account information about the specific headphone model.

Some multimedia players have the option to set gains of an equalizer (typically 3-10 bands) in order to control the frequency response manually. For example, reference is made to FIG. 10, which shows a screenshot of a 10 band equalizer in the "Winamp" media player. However, the frequency resolution is not sufficient for high-quality equalization, and the filter parameters to be set are not known to the user.

One application on a professional audio processing device allows a selection of a predefined set of ten professional headphone models (for details, see reference [8]). Moreover, reference is also made to FIG. 11, which shows a screenshot of the so-called "Engage" algorithm with a headphone selection. However, a choice of headphone filters is limited. Also, the headphone equalization can only be applied together with binauralization.

In the following, an automatic detection and equalizing of headphones will be briefly discussed. The smart-phone HTC Sensation XL is shipped together with Beats Audio headphones (for details, see reference [9]). This smart-phone recognizes these headphones automatically and applies an equalization filter that promises "a perfect sound experience".

In the following, equalization/correction filter systems for audio speakers will be briefly described. Their equalization/correction filter system is especially designed for loudspeakers. For example, the German speaker manufacturer Nubert developed such a device for their loudspeakers. For details, reference is made, for example, to FIG. 12, which shows a few of so-called "Nubert active tuning module (ATM) device". For further details, reference is made to reference [10].

The filter system is hardware based and works on analog signals, It has to be linked in between the pre-amplifier (or, alternatively, a playback device, like, for example, CD player) and the power amplifier. The focus is primarily on expanding the lower cutoff frequency. For example, FIG. 13, shows how the lower cutoff frequency is expanded by a Nubert ATM. The system only fits for exactly one specific type of loudspeaker. There is no way to match the device for another type of loudspeaker. For a different loudspeaker, it would be useful to buy/connect a different ATM device.

To summarize the above, there is a desire to have a concept which allows for an improvement of an audio quality of sound produced by a sound transducer which works for a wide variety of different sound transducers (for example, a large variety of different headphone types).

SUMMARY

According to an embodiment, an apparatus for processing an audio signal for reproduction by a sound transducer may have: an equalization parameter determinator for determining a set of equalization parameters; and an equalizer configured to equalize an input audio signal, to acquire an equalized audio signal; wherein the equalization parameter determinator includes a sound transducer identification configured to identify a sound transducer using an image recognition, and a parameter selection configured to select a set of equalization parameters in dependence on a result of the sound transducer identification; wherein the image recognition is configured to identify the sound transducer on the basis of a specific shape of the sound transducer.

According to another embodiment, an apparatus for processing an audio signal for reproduction by a sound transducer may have: an equalization parameter determinator for determining a set of equalization parameters; and an equalizer configured to equalize an input audio signal, to acquire an equalized audio signal; wherein the equalization parameter determinator is configured to acquire a set of equalization parameters using a measurement of an impedance of the sound transducer over frequency; wherein the equalization parameter determinator is configured to combine equalization parameters associated with a plurality of reference sound transducers, the reference impedance curves over frequency of which exhibit at least a similarity in at least one distinctive feature with the measured impedance over frequency of the sound transducer, to acquire the set of equalization parameters.

According to another embodiment, a system may have: a global equalization database, which defines an association between types of sound transducers and corresponding sets of equalization parameters and which is accessible by multiple apparatuses for processing an audio signal of multiple users, such that it is possible to share an equalization parameter setting identified by a user with other users; an apparatus for processing an audio signal for reproduction by a sound transducer, which apparatus may have: an equalization parameter determinator for determining a set of equalization parameters; and an equalizer configured to equalize an input audio signal, to acquire an equalized audio signal; wherein the equalization parameter determinator is configured to set the equalization parameters in dependence on a user input from a user interface; and wherein the equalization parameter determinator is configured to upload the set of equalization parameters and an information about the sound transducer to the global equalization database, which is accessible by multiple apparatuses for processing an audio signal of multiple users, such that it is possible to share an equalization parameter setting identified by a user with other users.

According to another embodiment, a system may have: a global equalization database; and an apparatus for processing an audio signal for reproduction by a sound transducer, which apparatus may have: an equalization parameter determinator for determining a set of equalization parameters; and an equalizer configured to equalize an input audio signal, to acquire an equalized audio signal; wherein the equalization parameter determinator includes a sound transducer identification configured to identify a sound transducer using an image recognition, and a parameter selection configured to select a set of equalization parameters in dependence on a result of the sound transducer identification; wherein the image recognition is configured to identify the sound transducer on the basis of a specific shape of the sound transducer, an apparatus for processing an audio signal for reproduction by a sound transducer according to claim 3, wherein the global equalization database defines an association between types of sound transducers and corresponding sets of equalization parameters, wherein the global equalization database is accessible by multiple apparatuses for processing an audio signal of multiple users, such that it is possible to share an equalization parameter setting identified by a user with other users.

According to another embodiment, a method for processing an audio signal for reproduction by a sound transducer may have the steps of: determining a set of equalization parameters; and equalizing an input audio signal, to acquire an equalized audio signal; wherein determining the set of equalization parameters includes identifying a sound transducer using an image recognition, and selecting a set of equalization parameters in dependence on a result of the sound transducer identification, wherein the image recognition includes identifying the sound transducer on the basis of a specific shape of the sound transducer.

According to another embodiment, a method for processing an audio signal for reproduction by a sound transducer may have the steps of: determining a set of equalization parameters; and equalizing an input audio signal, to acquire an equalized audio signal; wherein a set of equalization parameters is acquired using a measurement of an impedance of the sound transducer over frequency; wherein the method includes combining equalization parameters associated with a plurality of reference sound transducers, the reference impedance curves over frequency of which exhibit at least a similarity in at least one distinctive feature with the measured impedance over frequency of the sound transducer, to acquire the set of equalization parameters.

According to another embodiment, a method for processing an audio signal for reproduction by a sound transducer may have the steps of: determining a set of equalization parameters; and equalizing an input audio signal, to acquire an equalized audio signal; wherein the equalization parameters are set in dependence on a user input from a user interface; and wherein the set of equalization parameters and an information about the sound transducer are uploaded to a global equalization parameter database, which is accessible by multiple apparatuses for processing an audio signal of multiple users; and sharing an equalization parameter setting identified by a user with other users.

Another embodiment may have a computer program for performing the method according to claim 13 when the computer program runs on a computer.

Another embodiment may have a computer program for performing the method according to claim 14 when the computer program runs on a computer.

Another embodiment may have a computer program for performing the method according to claim 15 when the computer program runs on a computer.

An embodiment according to the invention creates an apparatus for processing an audio signal for reproduction by a sound transducer. The apparatus comprises an equalization parameter determinator for determining a set of equalization parameters and an equalizer configured to equalize an input audio signal, to obtain an equalized audio signal. The equalization parameter determinator comprises a sound transducer identification configured to identify a sound transducer using an image recognition and a parameter selection configured to select the set of equalization parameters in dependence on a result of the sound transducer identification.

This embodiment according to the invention is based on the finding that an automatic identification of a sound transducer (for example, a headphone) significantly facilitates a selection of an appropriate set of equalization parameters, and that the automatic identification of the sound transducer can be performed efficiently in many modern devices using image recognition capabilities which are already available on many modern devices, like, for example, computers, smart-phones and many other communication devices and multimedia devices. Accordingly, a user does not need to select the type of sound transducer from a long list manually. Moreover, an image recognition can be used to provide much more detailed data than a typical user would be willing to enter manually. Thus, identification of a sound transducer on the basis of an image recognition and the selection of equalization parameters in dependence on a result of said sound transducer identification allows for a user-friendly adjustment of the set of equalization parameters, which, in turn, allows for a good quality equalization using said selected set of equalization parameters and thereby brings along a good audio quality and user satisfaction.

In an advantageous embodiment, the sound transducer identification is configured to obtain an image of a sound transducer, or of a label associated with the sound transducer (for example, attached to the sound transducer), and to identify the sound transducer on the basis of the image. Thus, different image recognition techniques are possible, wherein the sound transducers are recognized by their specific appearance (shape, color, and the like), and/or on the basis of a label associated with the sound transducer.

In an advantageous embodiment, the sound transducer identification is configured to evaluate an optical barcode or a multi-dimensional optical code (for example, a two-dimensional code, a QR Code, or the like) arranged on the sound transducer, in order to identify the sound transducer. Usage of an optical barcode or a multi-dimensional optical code allows for the usage of standardized information formats, which are designed to be recognizable with little effort and good reliability. Moreover, optical barcodes or multi-dimensional optical codes may be designed to carry a comparatively large amount of information, wherein the information may be numerical, alphanumerical, or the like. To summarize, by identifying the sound transducer on the basis of an optical barcode or a multi-dimensional optical code, it is possible to reliably identify the sound transducer using standard image recognition methods.

In an advantageous embodiment, the apparatus is configured to download one or more sets of equalization parameters associated with one or more sound transducers, from a server. This allows for a continuous extension of a number of supported sound transducers and avoids the need to have a very large database in the apparatus itself.

Another embodiment according to the invention creates another apparatus for processing an audio signal for reproduction by a sound transducer. This apparatus comprises an equalization parameter determinator for determining a set of equalization parameters and an equalizer configured to equalize an input audio signal to obtain an equalized audio signal. The equalization parameter determinator comprises a sound transducer identification configured to identify a sound transducer using an identification signal which is provided by the sound transducer via an audio connection and a parameter selector configured to select the set of equalization parameters in dependence on a result of the sound transducer identification.

This embodiment according to the invention is based on the finding that a sound transducer can be identified with little effort if an identification signal, which is used for the identification of the sound transducer and, consequently, for the selection of a set of equalization parameters, is transmitted via an audio connection. By re-using the audio connection for the communication of such an identification signal, the technical effort for the identification of the sound transducer can be kept reasonably small. For example, using this apparatus, it is not necessary to have any optical imaging means. Also, by communicating the identification signal via the audio connection, it is not necessary to have any additional connections (like, for example, additional lines, or an additional radio frequency link) for the identification of the sound transducer. Accordingly, the concept can be used with relatively small hardware effort.

In an advantageous embodiment, the sound transducer identification is configured to identify a sound transducer using an inaudible identification signal which is provided by the sound transducer and overlaid on an audio signal connection. By using such a concept, a single electrical connection can be used both for the transmission of audio signals and for the transmission of the identification signal. In other words, a single line, or pair of lines, can be shared for a transmission of an audio content and for a transmission of the identification signal, such that a number of lines, and/or a number of pins of a connector, can be kept as small as possible. This helps to avoid unnecessary costs and also allows for a reduction of the size.

In an advantageous embodiment, the sound transducer identification is configured to identify a sound transducer on the basis of an identification signal which is provided by the sound transducer in a frequency range which is outside of an audible frequency range. By using an inaudible frequency range (for example, frequencies over about 20 kHz) for the identification signal, it can be ensured, with little effort, that an audio quality is not degraded by the presence of the identification signal.

In another advantageous embodiment, the sound transducer identification is configured to identify a sound transducer on the basis of a spread spectrum identification signal provided by the sound transducer. By using a spread spectrum identification signal, it can be achieved that the identification signal is substantially inaudible to a user and consequently does not damage the user satisfaction.

In an advantageous embodiment, the apparatus is configured to download one or more sets of equalization parameters associated with one or more sound transducers from a server. In this case, the equalization parameter determinator is configured to select one of the one or more downloaded sets of equalization parameters in response to an identification of a sound transducer. By downloading sets of equalization parameters from a server, the system can usually be adapted to a large number of different sound transducers while keeping the memory requirements in the apparatus for processing an audio signal reasonably small. Also, new models of sound transducers can be added flexibly.

Another embodiment according to the invention creates another apparatus for processing an audio signal for reproduction by a sound transducer. This apparatus comprises an equalization parameter determinator for determining a set of equalization parameters and an equalizer configured to equalize an input audio signal, to obtain an equalized audio signal. The equalization parameter determinator is configured to obtain a set of equalization parameters using a measurement of an impedance of the sound transducer over frequency.

This embodiment, according to the invention is based on the finding that the impedance of a sound transducer over frequency is a characteristic feature of a sound transducer which typically allows for an appropriate setting of the equalization parameters. It has been found that, in some cases, a sound transducer can be uniquely identified using a measurement of an impedance of the sound transducer over frequency, because the evolution of the impedance of the sound transducer over frequency is closely related to the specific design of the sound transducer and can be considered as a "fingerprint" of the sound transducer. Moreover, it has been found that, even if it is not possible to uniquely identify a sound transducer using the measurement of the impedance of the sound transducer over frequency (for example, because there are multiple similar sound transducers, or because there are some fabrication tolerances or measurement tolerances), it is still possible to derive an appropriate set of equalization parameters from the measurement of the impedance of the sound transducer over frequency, because the impedance of the sound transducer correlates with the specific design of the sound transducer (which, in turn, correlates with the appropriate equalization parameters). In other words, it has been found that a measurement of an impedance of the sound transducer over frequency, which is typically possible with a moderate circuit effort, provides a very good basis for the proper selection of equalization parameters, irrespective of whether a specific sound transducer can be uniquely identified or not. Moreover, by using this concept, it is not necessary that the sound transducer is specifically adapted for an identification, since the impedance of the sound transducer over frequency is an inherent characteristic of every sound transducer.

In an advantageous embodiment, the equalization parameter determinator comprises a sound transducer identification configured to identify a sound transducer using a measurement of an impedance of the sound transducer over frequency, and to select a set of equalization parameters in dependence on a result of the sound transducer identification. This embodiment is based on the idea that it is often possible to (uniquely) identify a sound transducer on the basis of the measurement of the impedance of the sound transducer over frequency. In this case, it is an efficient solution to select a set of equalization parameters (which may, for example, be stored in a database) on the basis of the result of the identification.

In an advantageous embodiment, the equalization parameter determinator is configured to compare a measured impedance of the sound transducer over frequency (i.e., for a plurality of frequency values) with a plurality of reference impedance curves (each represented, for example, by a plurality of impedance values associated with a plurality of different frequencies) over frequency (which are associated to reference sound transducers, and which may be stored in a database), and to select a set of equalization parameters in dependence on a result of the comparison. The comparison between a measured impedance of the actually used sound transducer over frequency with a plurality of reference impedance curves over frequency, which may have been measured previously by the manufacturer of the reference sound transducers, or by any other entity, has been found to be a simple and reliable approach for identifying a sound transducer.

In an advantageous embodiment, the equalization parameter determinator is configured to determine measures of differences (like, for example, mean-square-differences) between the measured impedance of the (actually used) sound transducer over frequency and the reference impedance curves (of the reference sound transducers) over frequency, and to select a set of equalization parameters in dependence on the measures of differences. It has been found that differences between the measured impedance of the sound transducer over frequency and the reference impedance curves over frequency can be determined with moderate computational effort. For example, even the impedances are described by complex values, differences (difference values) between the measured complex impedance values of the actually used sound transducer and previously measured complex reference impedance values can be computed. These difference values may, for example, be weighted to form a norm which describes, for example, as a single numeric value ("measure of difference") the difference between the measured impedance of the actually used sound transducer over frequency and the previously measured reference impedance curve. However, different concepts of determining a measure of difference are naturally applicable, wherein differences in the magnitudes of the impedances and differences in the phases of the impedances may be weighted differently. However, by determining measures of differences between the measured impedance of the actually used sound transducer over frequency and the reference impedance curves over frequency, it is possible to determine which reference impedance curve over frequency is "most similar", with respect to the used rule or norm for determining the measure of difference, to the measured impedance of the actually used sound transducer over frequency. Accordingly, it is easily possible to select (for example, from the database) the set of equalization parameters which is associated with the reference impedance curve over frequency that is "most similar" to the measured impedance of the actually used sound transducer over frequency.

In an advantageous embodiment, the equalization parameter determinator is configured to access a database which comprises an association between reference impedance curves over frequency and associated sets of equalization parameters. Accordingly, it is possible to efficiently manage the reference impedance curves over frequency. Also, it is possible to update the set of reference impedance curves over frequency by adding an entry to the database. Moreover, the usage of a database, which may be stored locally in the apparatus for processing an audio signal, or which may be stored remotely on a server, or which may be partly downloaded from the server to the apparatus for processing an audio signal, helps to achieve a maximum flexibility.

In an advantageous embodiment, the equalization parameter determinator is configured to combine equalization parameters associated with a plurality of reference sound transducers, the reference impedance curves over frequency of which have a similarity (or, as a special case, even an identity) in at least one distinctive feature (or, equivalently, characteristic feature) with the measured impedance of the (actually used) sound transducer over frequency, to obtain the set of equalization parameters (for the actually used sound transducer). This concept is particularly advantageous if there is no set of equalization parameters available for the actually used sound transducer. However, it has been found that the equalization parameters of "similar" sound transducers having similar impedance curves over frequency are typically similar. For example, it has been found that sound transducers having similar impedance curves in a specific frequency range can typically be operated with good sound quality using the same (or similar) equalization parameters at least for said specific frequency range. However, different "overall characteristics" of the impedance curve may also be identified, and the equalization parameters of sound transducers having such similarities in their "overall impedance curves" (over a broad frequency range) may typically use similar equalization parameters. In other words, if a plurality of reference impedance curves are identified which have at least one distinctive feature in common with the measured impedance of the sound transducer over frequency (or which have a sufficient similarity in at least one distinctive feature), the equalization parameters associated with these identified reference impedance curves can be combined, and the result of this combination (i.e., a set of equalization parameters obtained by the combination) will typically provide reasonably good results with the actually used sound transducer. For example, multiple distinctive features (like, for example, a low frequency impedance characteristic, a high frequency impedance characteristic, a resonance frequency, or any other characteristic of the measured impedance over frequency) may be evaluated, and for each characteristic feature under consideration, a reference impedance curves may be identified which best approximates said characteristic feature under consideration. Subsequently, equalization parameters (or sets of equalization parameters) associated with the identified reference impedance curves (which have one or more distinctive features in common with the measured impedance curve) are combined. The combination may, for example, comprise a weighted combination, wherein the weighting may be preset. Moreover, the equalization parameters associated with the identified reference impedance curves may also be combined such that equalization parameters associated with different of the identified reference curves are weighted differently relative to each other over frequency, such that, for example, equalization parameters associated with the first identified reference impedance curve are weighted stronger in a first frequency region than in a second frequency region, while equalization parameters associated with a second identified reference impedance curve are weighted stronger in the second frequency region than in the first frequency region. Thus, the concept to combine equalization parameters associated with a plurality of different identified reference impedance curves allows to provide a set of equalization parameters which is well-adapted to a measured impedance over frequency of an actually used sound transducer even if none of the reference impedance curves perfectly fits the measured impedance over frequency.

In an advantageous embodiment, the equalization parameter determinator is configured to combine fitting features of a plurality of sets of equalization parameters (for example, filter settings or filter coefficients) associated with different reference impedance curves over frequency, to obtain the set of equalization parameters associated with the measured impedance of the sound transducer.

In an advantageous embodiment, the reference impedance curves over frequency are based on previous impedance measurements using reference sound transducers. In this case, the sets of equalization parameters are advantageously based on a pre-computation on the basis of previous frequency response measurements using the reference sound transducers. Accordingly, it is possible to obtain a set of equalization parameters for an "unknown" (currently used) sound transducer by a combination of equalization parameters of reference sound transducers, which have been obtained in a reliable manner (for example, at the side of the manufacturer, or at the side of some audio specialists). Accordingly, good results can be obtained.

In an advantageous embodiment, the apparatus for processing an audio signal is configured to receive results of a measurement of an impedance of the (actually used) sound transducer over frequency from an impedance measurement device configured to determine a ratio between a voltage and a current at a sound transducer connection (or, equivalently, at some point of an amplifier providing a signal to the sound transducer) for different frequencies. Thus, the apparatus for processing an audio signal can compute the impedance on the basis of the information about the voltage and the information about the current.

In an advantageous embodiment, the impedance measurement device is configured to determine a complex-valued impedance of the sound transducer over frequency, for example, in a Cartesian representation or in a polar representation. Thus, both amplitude and phase of the impedance of the (actually used) sound transducer can be considered.

Another embodiment according to the invention creates an apparatus for processing an audio signal for reproduction by a sound transducer. The apparatus comprises an equalization parameter determinator for determining a set of equalization parameters and an equalizer configured to equalize an input audio signal, to obtain an equalized audio signal. The equalization parameter determinator is configured to set the equalization parameters in dependence on a user input from a user interface. The equalization parameter determinator is also configured to upload the set of equalization parameters and an information about the sound transducer to a global equalization parameter database, which is accessible by multiple apparatuses for processing an audio signal of multiple users. Accordingly, it is possible to share a "good" equalization parameter setting with other users. The uploaded information about the sound transducer may, for example, comprise a sound transducer identifier (for example, a sound transducer model number or the like), or an information about characteristics of the sound transducer (for example, measured impedance values, or the like). Thus, experienced users, who have been able to identify a "good" equalizer setting for a specific sound transducer, can contribute to an improvement of the global equalization parameter database, which, in turn, allows for an "easy" automated selection of the set of equalization parameters for other users who may access the database. Accordingly, a growing amount of equalization parameter information is collected, which generally allows to improve user satisfaction.

In an advantageous embodiment, the equalization parameter determinator further comprises a sound transducer identifier configured to identify a sound transducer and to select a set of equalization parameters based on the identification of the sound transducer. The apparatus is also advantageously configured to download one or more sets of equalization parameters from the global equalization parameter database. The sound transducer identifier is advantageously configured to take into account the one or more downloaded sets of equalization parameters. This embodiment according to the invention brings along the advantage that it is usable in many situations. If a set of equalization parameters is available in the global equalization parameter database for an identified sound transducer, the apparatus may simply use (or, more generally, take into account) the one or more downloaded sets of equalization parameters. In contrast, if it is not possible to identify a sound transducer, or if it is not possible to obtain a set of equalization parameters for the identified sound transducer (for example, because there are no equalization parameters available in the global database for the identified sound transducer), a user may still manually set the equalization parameters using an appropriate user interface. Also, in this situation, the user can contribute to the improvement of the global equalization parameter database, such that the users who are able to find appropriate equalization parameters have the possibility to facilitate the life of other users with an identical apparatus. Thus, the user satisfaction can be significantly improved.

Another embodiment according to the invention creates a system. The system comprises a global equalization parameter database and an apparatus for providing an audio signal, as described above. Such a system brings along the same advantages which have been discussed for the apparatus for providing an audio signal.

Further embodiments according to the invention create methods for processing an audio signal, which are based on the same ideas and considerations as the apparatuses described above.

Further embodiments according to the invention create a computer program for performing one of said methods.

BRIEF DESCRIPTION OF THE DRAWINGS

Embodiments of the present invention will be detailed subsequently referring to the appended drawings, in which:

FIGS. 4A-1 and 4A-2, shows a graphic representation of examples of acoustical responses (left) versus electrical impedance responses (right) for two different types of headphones: intra-concha (upper) and circum-aural (lower);

FIG. 4B shows table representation of differences in the impedance response of two different types of headphones;

DETAILED DESCRIPTION OF THE INVENTION

1. Apparatus for Processing an Audio Signal, According to FIG. 1

Figure 1:
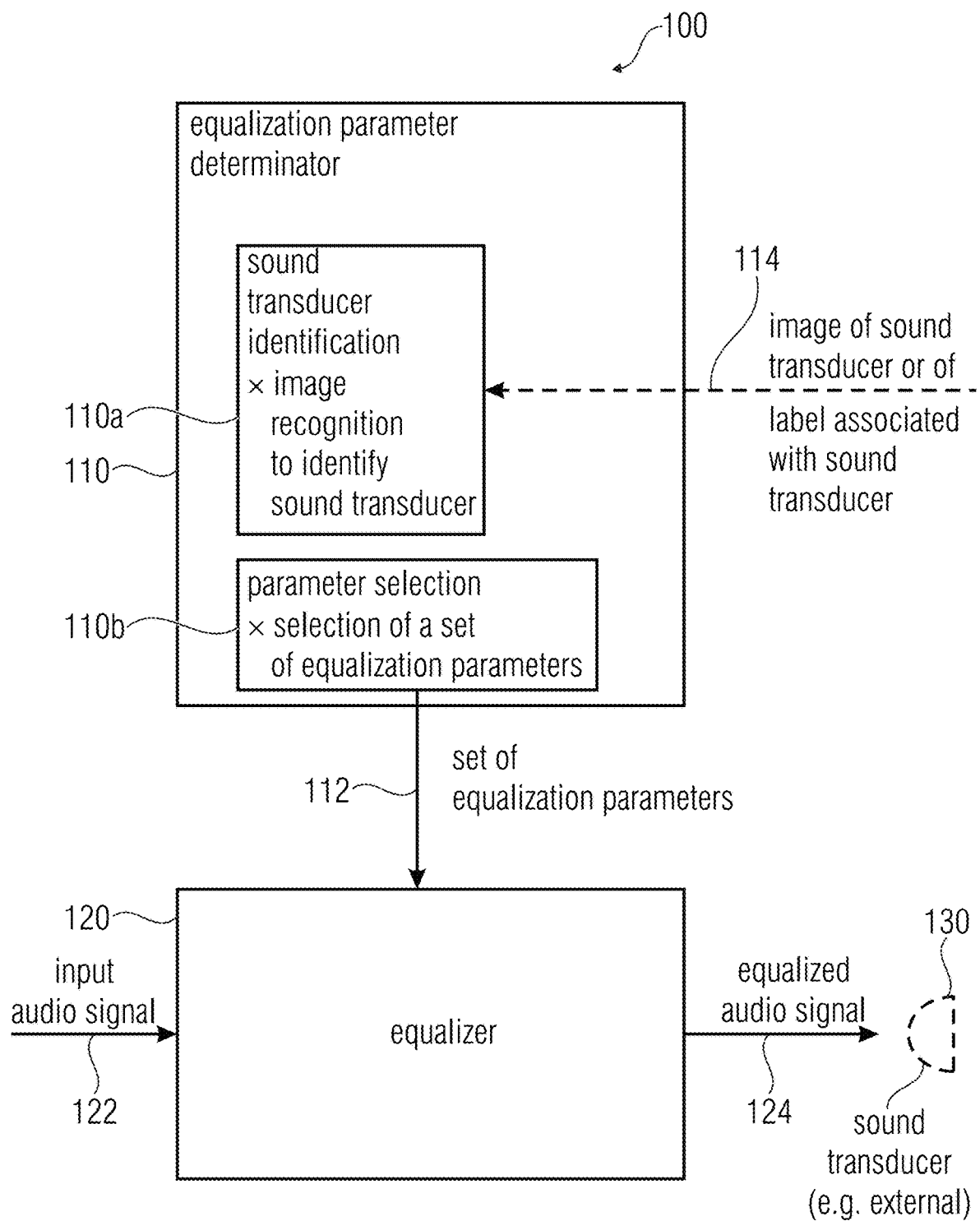
FIG. 1 shows a block schematic diagram of an apparatus for processing an audio signal for reproduction by a sound transducer, according to a first embodiment.

FIG. 1 shows a block schematic diagram of an apparatus for processing an audio signal for reproduction by a sound transducer, according to a first embodiment of the present invention. The apparatus according to FIG. 1 is designated in its entirety with 100.

The apparatus 100 comprises an equalization parameter determinator 110 for determining a set 112 of equalization parameters. The apparatus 100 also comprises an equalizer 120 configured to equalize an input audio signal 122, to obtain an equalized audio signal 124. The equalizer 120 typically receives the set 112 of equalization parameters provided by the equalization parameter determinator 110 for the equalization.

The equalized audio signal 124 is intended for reproduction by a sound transducer 130, wherein the sound transducer 130 is typically not part of the apparatus 100. Rather, the sound transducer 130 is typically an external sound transducer like, for example, an external loudspeaker, headphone, headset, or the like.

The equalization parameter determinator 110 comprises a sound transducer identification 110a which is configured to identify a sound transducer using an image recognition. For example, the sound transducer identification 110a may receive a representation 114 of an image of the sound transducer 130 or of a label associated with the sound transducer 130. The equalization parameter determinator also comprises a parameter selection 110b which is configured to select a set of equalization parameters in dependence on a result of the sound transducer identification.

Accordingly, the equalization parameter determinator 110 provides the set 112 of equalization parameters for usage by the equalizer 120 on the basis of a sound transducer identification, which uses a representation of an image of the sound transducer 130 or a representation of an image of a label associated with a sound transducer 130 as an input information. Once the sound transducer identification 110a is able to identify the sound transducer 130, i.e. to provide an identifier (for example a number, a string, or the like) (uniquely or at least in terms of a specific category or class) identifying the sound transducer (or, more precisely, the type of sound transducer), the parameter selection 110b may select a set of equalization parameters for usage by the equalizer 120 on the basis of the identifier information provided by the sound transducer identification 110a. Accordingly, it is possible to determine an appropriate set of equalization parameters automatically, provided that it is possible to identify the sound transducer 130 using an image recognition and that a set of equalization parameters is available for the identified sound transducer.

The image recognition may be based on different mechanisms. For example, the image recognition may identify the sound transducer on the basis of the specific shape of the sound transducer. For example, in a first step, different types of sound transducers may be easily distinguished by their entirely different appearance (intra-canal versus intra-concha versus supra-aural versus circum-aural). An even more detailed identification may be based on additional features, like, for example, dimensions of specific elements of the sound transducer, ratios between dimensions of different elements of the sound transducer, letters or signs arranged on the sound transducers, and the like. The sound transducer identification 110a may, in some embodiments, be precise enough to identify a specific model of sound transducer. However, in other cases, it may be sufficient to identify the general type of sound transducer, and possibly some key features (like, for example, dimensions, ratios between different dimensions, etc.), such that the sound transducer may be classified (i.e., assigned to a specific group or class of sound transducers). Thus, the sound transducer identifier provided by the sound transducer identification 110a may comprise different precisions in different embodiments.

The parameter selection 110b may use a database which is contained within the apparatus 100 or may access an external database to obtain a set of equalization parameters for the sound transducer (or class of sound transducer) identified by the sound transducer identification 110a. In other words, the sound transducer identification information provided by the sound transducer identification 110a on the basis of the image of the sound transducer, or of a label associated with the sound transducer, may be used to query a database (or a table) associating a set of equalization parameters to a sound transducer identifier. Thus, an appropriate set of equalization parameters, associated with the sound transducer identifier provided by the sound transducer identification 110a, may be provided to the equalizer 120.

In an alternative embodiment, a label associated with the sound transducer (for example, attached to the sound transducer or to a packaging of the sound transducer) may be evaluated by the image recognition of the sound transducer identification 110a, rather than the shape of the sound transducer. For example, an optical barcode or a multi-dimensional optical code (for example, a two-dimensional optical code, like a QR code) may be evaluated by the image recognition of the sound transducer identification 110a, to obtain a sound transducer identifier. For example, a number content or a textual content of a barcode or a multi-dimensional optical code may be used as a sound transducer identifier for the selection of a set of equalization parameters.

Thus, it may be sufficient to take an image of the sound transducer or of a label associated with the sound transducer, to allow for an automatic selection of equalization parameters which fit the sound transducer. For example, such an image may be easily taken within the camera which is typically integrated into a smart-phone, laptop computer, or another multimedia device. Consequently, it is very easy for a user of such a device, which comprises the apparatus 100, to obtain an appropriate set of equalization parameters. Thus, a user satisfaction is typically improved.

Further details regarding the sound transducer identification and regarding possible extensions of the apparatus 100 will be described below (for example, taking reference to FIGS. 6 and 7).

2. Apparatus for Processing an Audio Signal According to FIG. 2

Figure 2:
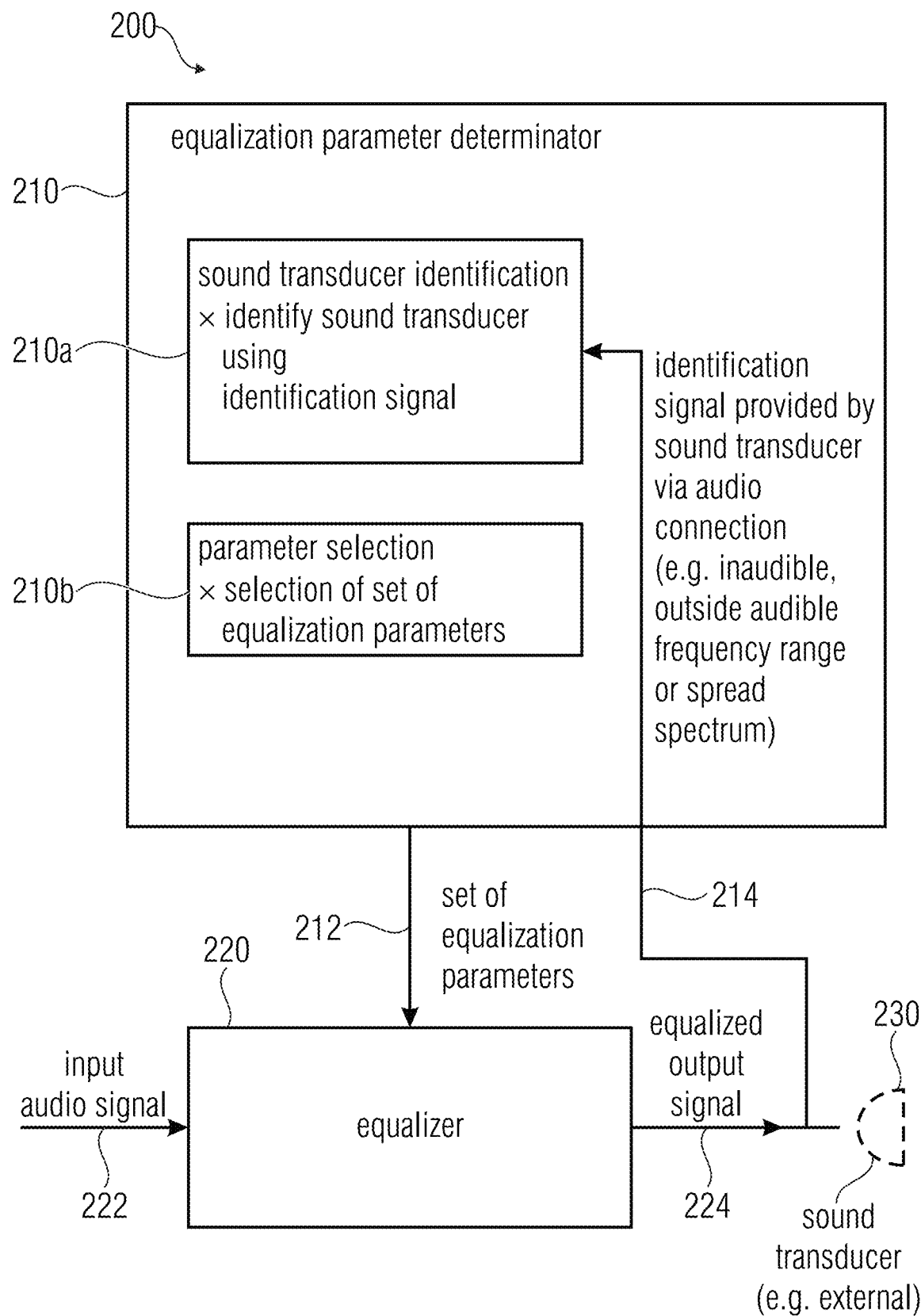
FIG. 2 shows a block schematic diagram of an apparatus for processing an audio signal for reproduction by a sound transducer, according to a second embodiment.

FIG. 2 shows a block schematic diagram of an apparatus for processing an audio signal for reproduction by a sound transducer, according to a second embodiment of the present invention. The apparatus according to FIG. 2 is designated in its entirety with 200.

The apparatus 200 comprises an equalization parameter determinator 210 for determining a set 212 of equalization parameters. The apparatus 200 further comprises an equalizer 220 configured to equalize an input audio signal 222, to obtain an equalized audio signal 224, which is intended to be reproduced by a sound transducer 230, which typically is external to the apparatus 200.

The equalization parameter determinator 210 comprises a sound transducer identification 210a which is configured to identify a sound transducer using an identification signal 214 which is provided by the sound transducer via an audio connection. The equalization parameter determinator also comprises a parameter selection 210b which is configured to select a set of equalization parameters in dependence on a result of the sound transducer identification 210a. For example, the parameter selection 210b may receive a sound transducer identifier from the sound transducer identification 210a and select a corresponding set of equalization parameters 212 for usage by the equalizer on the basis of the sound transducer identifier.

The identification signal 214 may be received by the apparatus 200 (or by the equalization parameter determinator 210) from the sound transducer 230 via an audio connection which also provides the equalized output signal 224, or an amplified and/or post-processed version thereof, to the sound transducer 230. For example, a common line or a common connector pin may be used both for outputting an audio signal to be output by the sound transducer 230 and for receiving the identification signal 214. Thus, an audio connection (or, more precisely, a specific line of the audio connection or a specific pin of an audio connector) may be reused both for transporting an audio information (for example, an analog audio information, i.e. an analog time domain signal) and the identification signal 214.

Accordingly, the apparatus 200 allows for a selection of an appropriate set of equalization parameters with comparatively moderate technical effort. For example, a number of connections (or connection conductors, or connector pins) between the apparatus 200 and the sound transducer 230 can be kept small by receiving the identification signal via the audio connection (for example, via an audio line, which is shared for the transmission of the identification signal). The identification signal may be separated from an audio content on the audio connection using a filter (for example, a high-pass filter) or a spread spectrum detector. Thus, an encoded information, which is contained in the identification signal or represented by the identification signal, may be used by the sound transducer identification 210a to obtain the sound transducer identification information, which is provided to the parameter selection 210b. For example, after a separation of the identification signal from the audio signal on the shared connection, some additional demodulation or decoding may be performed in some embodiments for an extraction of the information content of the identification signal.

To summarize the above, an information content of the identification signal provided by the sound transducer via the audio connection may be used to provide the sound transducer identification information, and to select, in response to the sound transducer identification information, an appropriate set of equalization parameters associated with the identified sound transducer 230. Thus, the equalization parameters of the equalizer 220 may be set to fit the identified sound transducer 230. Accordingly, it is possible to automatically adjust the equalizer 220 to obtain a good (or even optimal) hearing impression. Thus, a user satisfaction can be significantly improved.

Further details regarding the apparatus 200, and also regarding the identification of a sound transducer using the identification signal provided by the sound transducer will be described below, for example with reference to FIGS. 6 and 7.

3. Apparatus for Processing an Audio Signal According to FIG. 3

Figure 3:
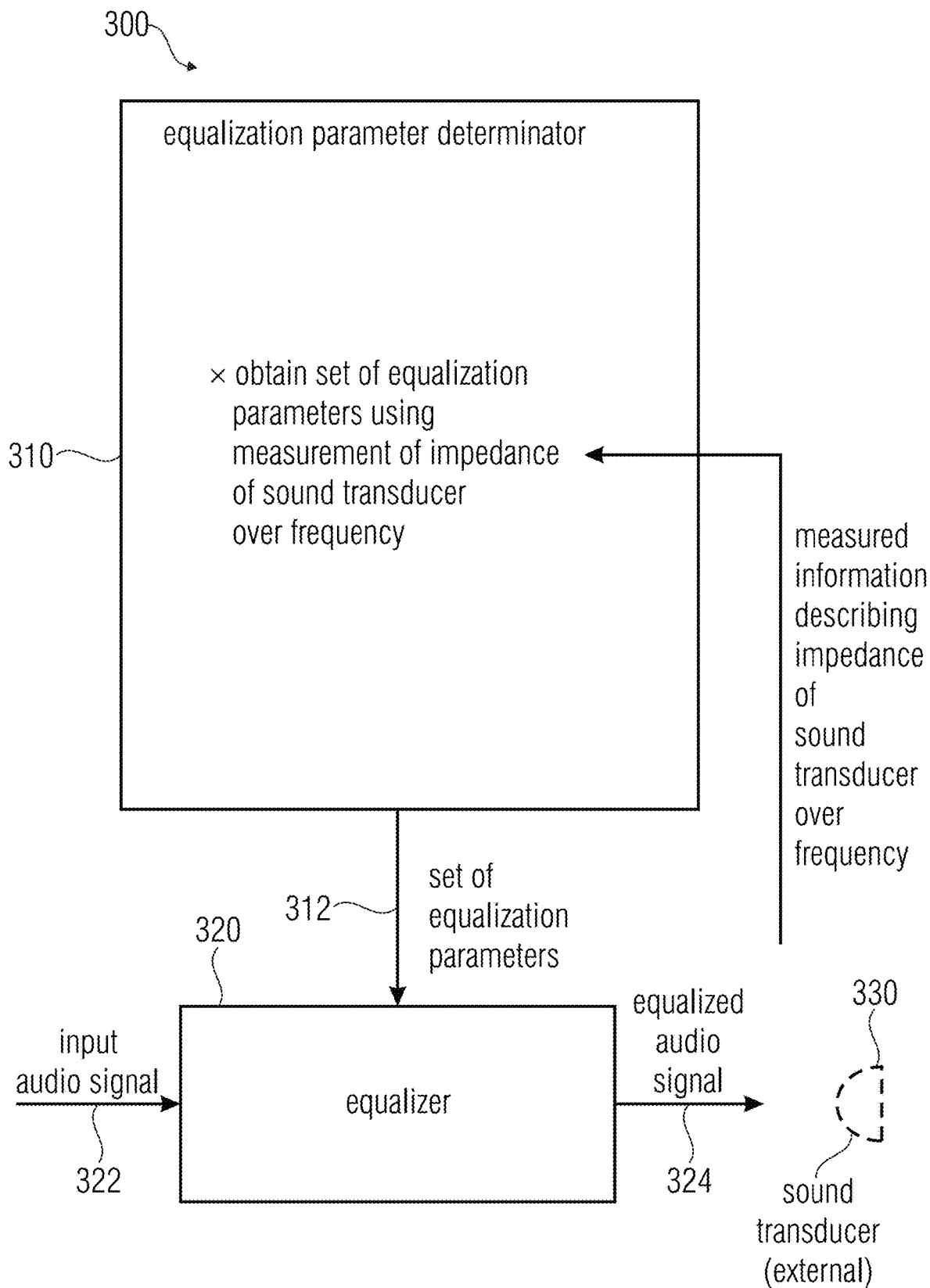
FIG. 3 shows a block schematic diagram of an apparatus for processing an audio signal for reproduction by a sound transducer, according to a third embodiment.

FIG. 3 shows a block schematic diagram of an apparatus for processing an audio signal according to a third embodiment of the present invention. The apparatus according to FIG. 3 is designated in its entirety with 300.

The apparatus 300 comprises an equalization parameter determinator 310 for determining a set 312 of equalization parameters. The apparatus 300 also comprises an equalizer 320 configured to equalize an input audio signal 322, to obtain an equalized audio signal 324, which is intended to be output by the sound transducer 330 (which is typically external to the apparatus 300).

The equalization parameter determinator 310 is configured to obtain a set 312 of equalization parameters using a measurement of an impedance of the sound transducer 330 over frequency. In some embodiments, the equalization parameter determinator 310 may be configured to perform said measurement of the impedance of the sound transducer over frequency. However, alternatively, the equalization parameter determinator 310 may receive a measured information describing the impedance of the sound transducer 330 over frequency from an impedance measurement device (which may be part of the apparatus 330, or which may be external to the apparatus 330).

There are different concepts for obtaining the set of equalization parameters using the measurement of the impedance of the sound transducer 330 over frequency (or, equivalently, the measured information describing the impedance of the sound transducer over frequency). For example, the measured information describing the impedance of the sound transducer over frequency may be used to identify the sound transducer 330. For example, the measured information describing the impedance of the sound transducer over frequency may be compared with a plurality of reference impedance curves over frequency of a plurality of reference sound transducers which may have been characterized by the manufacturer or by any other entity. Thus, if a sufficiently good match (within a tolerance defined, for example, by a threshold for a measure of difference) between the measured impedance of the actually used sound transducer over frequency and one of the reference impedance curves of the previously characterized sound transducers is found, it may be concluded by the equalization parameter determinator that the actually used sound transducer is of the same type (or at least a very similar type) as the corresponding previously characterized sound transducer. Thus, a set of equalization parameters associated with said corresponding previously characterized sound transducer (the reference impedance curve of which is in sufficiently good agreement with the measured impedance over frequency of the actually used sound transducer) may be used as the set 312 of equalization parameters for usage by the equalizer 320. Thus, the equalization parameter determinator 310 may, in this embodiment, obtain the set of equalization parameters by recognizing that the currently used sound transducer is sufficiently similar, with respect to its impedance over frequency, to a previously characterized sound transducer for which an appropriate set of equalization parameters is known.

In an alternative embodiment, or if the measured impedance over frequency of the actually used sound transducer is not sufficiently similar to any of the available reference impedance curves of the previously characterized sound transducers, the equalization parameter determinator may be configured to derive the set of equalization parameters from equalization parameters of multiple reference sound transducers, which comprise at least some similarities, with respect to the impedance over frequency, to the actually used sound transducer. In other words, the equalization parameter determinator may be configured to identify one or more "most distinctive" (or most characteristic) features of the measured impedance over frequency of the actually used sound transducer, and to identify a plurality of reference sound transducers, the reference impedance curves of which have the same distinctive (or characteristic) features (or at least sufficiently similar distinctive features or characteristic features) as the measured impedance over frequency of the actually used sound transducer. Thus, the equalization parameter determinator may combine (for example, in a weighted manner) equalization parameters associated with the reference sound transducers having identical or similar characteristic features (of the impedance over frequency) like the actually used sound transducers. For example, if the impedance over frequency of the actually used sound transducer comprises a plurality of most distinctive (or most characteristic) features, equalization parameters of such reference sound transducers, the characteristic impedances of which have at least one of said characteristic features in common with the actually used sound transducer, may be selectively combined (for example, in a weighted manner) to obtain the set 312 of equalization parameters for usage by the equalizer 320.

If the different most distinctive features are related to different frequency regions, the equalization parameter determinator may determine the equalization parameters of the set 312 of equalization parameters separately for the different frequency regions, wherein the actually used equalization parameters (of the set 312 of equalization parameters) for a given frequency region may be obtained on the basis of equalization parameters of one or more reference sound transducers, the reference impedance curves of which are most similar (in terms of one or more characteristic features, or in term of their overall evolution) to the measured impedance over frequency for the given frequency region.

However, different concepts how to combine the equalization parameters of multiple reference sound transducers to obtain the set 312 of equalization parameters are also possible. Nevertheless, it is typically observed that the reference impedance curves of those reference sound transducers, whose equalization parameters are considered for the determination of the set 312 of equalization parameters, have at least a similarity with one of the one or more most distinctive features of the measured impedance over frequency of the actually used sound transducer.

In the following, some possibilities for the automatic sound transducer identification using a measurement of an electrical impedance over frequency will be briefly summarized. For the detection of a headphone, the electrical impedance-over-frequency curve (for example, of the actually used sound transducer) may be matched to a specific headphone, or at least a specific headphone class. For some fundamental considerations, reference is made to reference [11]. The electrical impedance-over-frequency curve can be measured using currently developed devices like, for example, amplifiers which can perform current sensing to e.g. prevent speaker damage (see, for example, reference [11]).

For example, after plugging in new headphones (for example, into the apparatus 300), a measurement process may be performed while voltage and current are recorded to calculate a complex impedance over frequency. In other words, a plurality of impedance values (for example of the sound transducer 330) are measured for a plurality of different frequencies (advantageously for at least five or at least 10 different frequencies). Moreover, advantageously complex impedance values are determined which describe both a real part and an imaginary part of the impedance of the sound transducer (for example, of the sound transducer 330). Different types of representation (real part/imaginary part, or magnitude/phase) can be used to describe these complex impedance values. Thus, there are typically a plurality of complex values for a plurality of frequencies (for example, for at least five different frequencies or for at least ten different frequencies) which describe a measured impedance over frequency of the actually used sound transducers.

Figures 1, 4A:
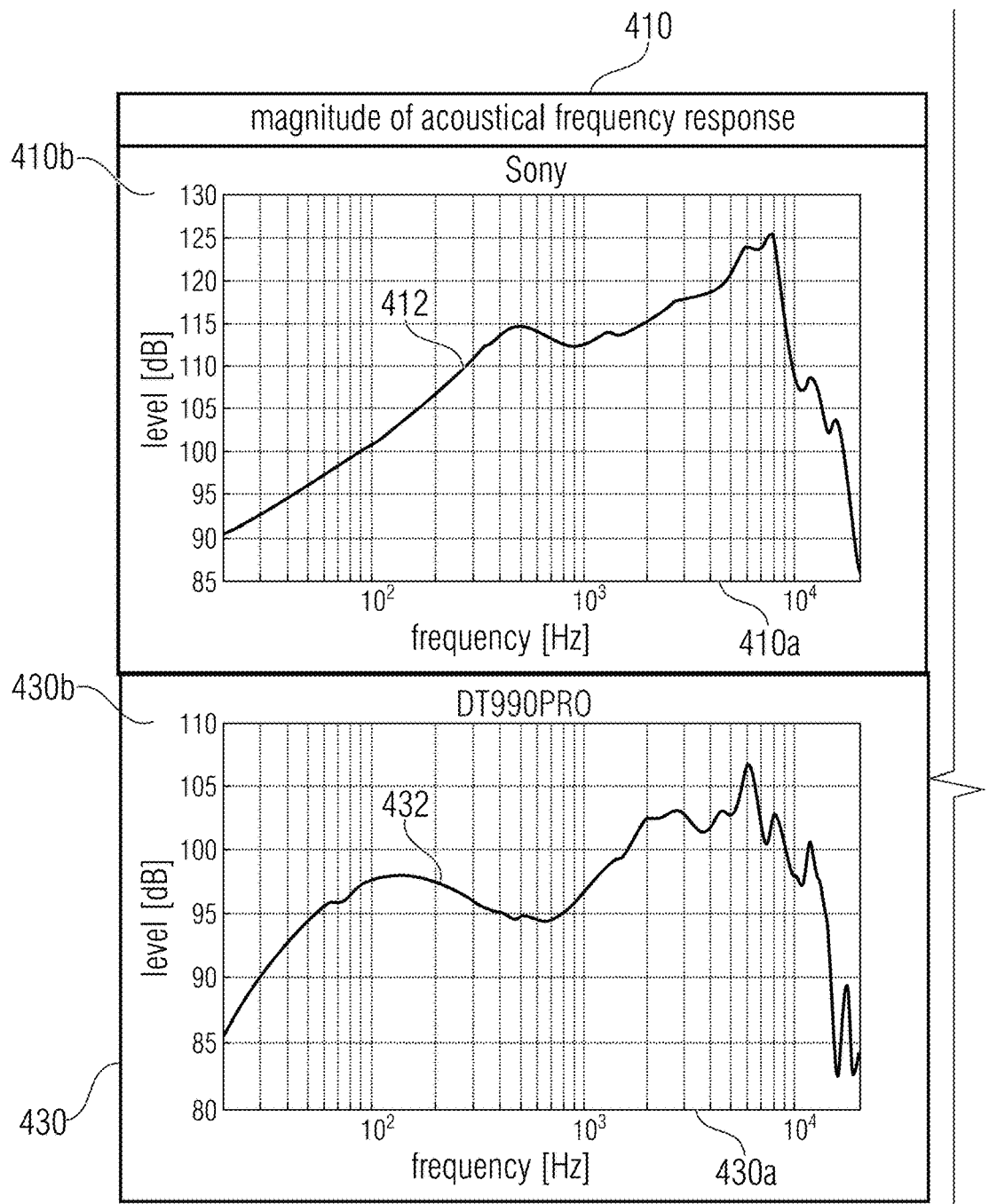
FIG. 4A, which includes

Moreover, it should be noted that the impedance curves of different types of headphones show distinctive differences and features. For example, reference is made to the right side (right column, reference numerals 420, 440) of FIG. 4a, which shows a graphic representation of acoustical responses (left) versus electrical impedance responses (right) for two different types of headphones. In other words, FIG. 4a shows an example of an intra-concha type (upper plot, reference numerals 410.420) and a circum-aural type (lower plot, reference numbers 430, 440). Moreover, reference is also made to the table of FIG. 4b, which shows a table representation of differences in the impedance response of two different types of headphones. In other words, FIG. 4b shows a table of differences. Taking reference now to FIG. 4a, it can be seen that a first graphical representation 410 represents a magnitude 412 of an acoustical frequency response of an intra-concha headphone. An abscissa 410a describes a frequency in Hz, and an ordinate describes a level (or relative level) in decibel. A second graphical representation 420 describes a magnitude 422 and a phase 424 of an electrical impedance response of the intra-concha headphone. An abscissa 420a describes a frequency in Hz, a first ordinate 420b describes a magnitude of the impedance in ohms, and a second ordinate 420c describes a phase in degrees. A third graphical representation 430 describes a magnitude 432 of an acoustical frequency response of a circum-aural headphone. An abscissa 430a describes a frequency in Hz and an ordinate 430b describes a level (or relative level) in decibel. A fourth graphical representation 440 describes a magnitude 442 and a phase 444 of an electrical impedance response of the circum-aural headphone. An abscissa 440a describes a frequency in Hz, a first ordinate 440b describes a magnitude of the impedance in ohms and a second ordinate 440c describes a phase of the electrical response in degrees.

Figures 2, 4A:
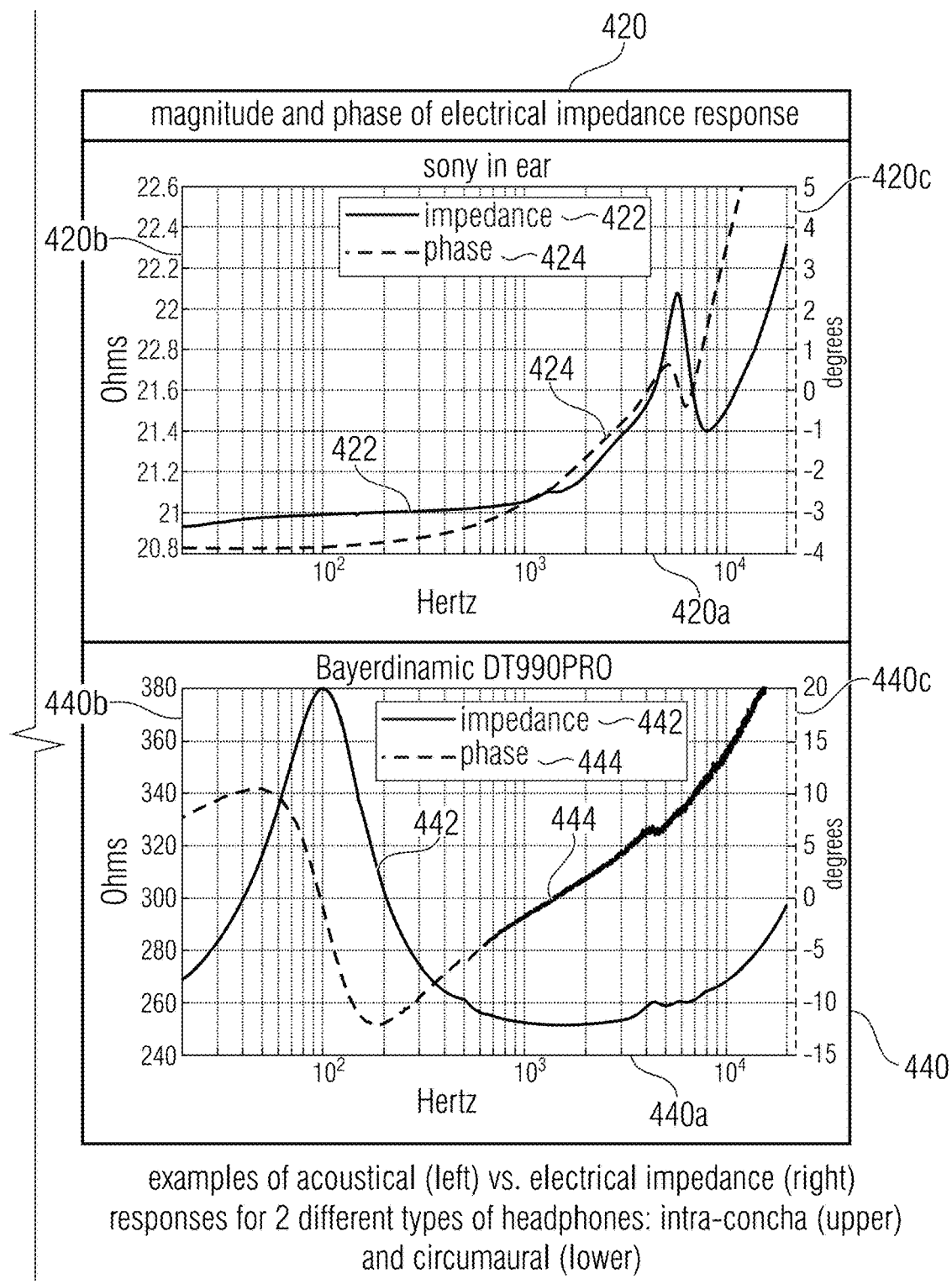

As can be seen from FIG. 4a, both the magnitude of the acoustical frequency response and the magnitude and phase of the electrical impedance response of the different headphones differ significantly. Moreover, it can be seen that different distinctive features can be extracted (for example, by the apparatus 300, or by the equalization parameter determinator 310) from a measured information describing an impedance of the headphones (sound transducers) over frequency. For example, an equalization parameter determinator could be configured to extract, as a characteristic feature, an average impedance over a certain frequency range. As can be seen, an average magnitude of the impedance of the intra-concha headphones is approximately 21.5 ohms over the frequency range shown in FIG. 4a. In contrast, an average magnitude of the impedance for the circum-aural headphone is approximately 300 Ohm over the frequency range shown in FIG. 4. Accordingly, the average impedance over a given frequency range could be considered as a distinctive feature. Moreover, a frequency at which the impedance reaches a peak could also be extracted by the equalization parameter determinator 310 as a characteristic feature. For example, the intra-concha headphone exhibits a local maximum of the impedance approximately at 6 kHz while the circum-aural headphone comprises such a maximum of the magnitude of the impedance at approximately 100 Hz (wherein it should be noted that the frequency, at which there is a maximum of the magnitude of the electrical impedance may be considered as a resonance frequency or main resonance frequency). Moreover, the variation of the magnitude of the electrical impedance over a given frequency range and the variation of the phase of the electrical impedance response over a given frequency range may also be determined as a distinctive feature by the equalization parameter determinator 310. As can be seen, the variation (or deviation) of the magnitude of the electrical impedance response is comparatively small for the intra-concha headphone. In contrast, a variation of the magnitude and of the phase of the electrical impedance response over the given frequency range is comparatively large for the circum-aural headphone. FIG. 4b shows a summary of distinctive features of the two example headphones discussed above, wherein it should be noted that said distinctive features can be determined by the equalization parameter determinator and used to decide which reference sound transducer will be considered as being sufficiently similar to the currently used sound transducer. However, any other distinctive features of the measured impedance over frequency may also be determined by the equalization parameter determinator.

To finally find the filter (or, more generally, the set of equalization parameters) which matches best to the frequency response (e.g. measured impedance over frequency) of the currently plugged-in headphones (as an example, see the left side of FIG. 4a, i.e., the graphic representations 410 and 130), one of the following two approaches (Approach A, Approach B) for a combination is used (for example, by the equalization parameter determinator) with the help of a database.

The database may be a table with two columns: electrical complex impedance curves (for example, reference impedance curves of reference sound transducers, represented by a plurality of reference impedance values for a plurality of different frequencies) on one side (e.g., in one table or column of a table) and the corresponding fitting headphone filters (or, more generally, a set of corresponding equalization parameters) on the other side (e.g., in another linked table, or another column of the table).

As previously mentioned, the filters (or, more generally, the sets of equalization parameters) are typically created from acoustical measurements, which usually cannot be done by an end user.

In the following, some different possible approaches for the determination of the set 312 of equalization parameters, which may be performed by the equalization parameter determinator 310, will be described.

Approach A: Table Lookup Identification

An error algorithm (for example, a least-mean-square algorithm) may be applied to compare the electrical impedance curve over frequency (for example, a magnitude and a phase) measured for the actually used sound transducer, which is connected to the apparatus 300, to previously measured electrical impedance curves (also designated as reference impedance curves of a reference sound transducer) stored in a database. If the error algorithm is successful matching the currently measured curve (of the sound transducer actually connected to the apparatus 300) to one of the database (i.e., to one of the reference impedance curves), the plugged-in headphones (i.e., the actually used headphones connected to the apparatus 300) are identified and the fitting filters (or, generally, the fitting set of equalization parameters) can be loaded (for example, from the database).

In other words, if the equalization parameter determinator 310 finds out, using an "error algorithm", which provides a measure of a difference between two impedance curves, that the measured impedance over frequency of the actually used sound transducer is identical, or sufficiently similar (within a predetermined tolerance defined by the error algorithm) to one of the reference impedance curves stored in the database, the equalization parameter determinator selects the set of impedance parameters associated with said identified reference impedance curve for usage by the equalizer 320.

Approach B: Filter Generation

If the Approach A (table lookup identification) is not possible or successful, a fitting filter may be generated. Unlike in Approach A (table lookup identification), an algorithm (for example, PCA analysis or principal component analysis) is performed on multiple previously measured electrical-impedance curves in the list (for example, in the database). For example, the equalization parameter determinator is configured to perform such an algorithm on multiple reference impedance curves (i.e., previously measured electrical impedance curves of reference sound transducers), wherein the equalization parameter determinator may be configured to obtain an information about the reference impedance curves from a database. The database may be stored locally on the apparatus 300, or may be downloaded partially, or completely, from a server. Thus, the equalization parameter determinator may extract one or more "distinctive features" from the reference impedance curves.

By using the most distinctive features (i.e., one or more of the distinctive or characteristic features) of an electrical impedance response of the currently measured headphone (i.e., of the measured impedance over frequency of the currently used sound transducer connected to the apparatus 300), the fitting features of different filters for multiple headphones may be combined to a corresponding filters in the frequency domain fitting for the specific headphone currently measured. In other words, the equalization parameter determinator may determine one or more "most distinctive" features of the measured impedance over frequency of the currently used headphone, and may identify a plurality of reference sound transducers (which are described by a database entry or by a table entry comprising a representation of a reference impedance curve and of a corresponding set of equalization parameters) which have a sufficient similarity (with respect to a similarity measure) of one or more "distinctive features" of their (reference) impedance curves over frequency with the most distinctive features of the measured impedance over frequency of the currently used sound transducer. Then, equalization parameters of these identified reference sound transducers are combined, to obtain the set 312 of equalization parameters for usage by the equalizer 320. Accordingly, even if neither of the reference impedance curves of the reference sound transducers "perfectly" matches the measured impedance over frequency of the actually used sound transducer, sound transducers are identified which have in common (or a sufficient similarity with respect to) one or more characteristics (distinctive features) of their impedance curves over frequency with the currently used sound transducer, and the equalization parameters determined previously for these identified reference sound transducers are combined, to obtain the equalization parameters for the equalization of the audio signal for the currently used sound transducer. The weighting of the equalization coefficients of the identified reference sound transducers in this combination can be determined, for example, in dependence on a measure of the similarity between the reference impedance curves of the reference sound transducer and the measured impedance over frequency of the actually used sound transducer. The weighting may also be chosen in a frequency-dependent manner, such that, for example, the low-frequency equalization parameters of a first reference sound transducer can be selectively weighted stronger than the equalization parameters of a second reference sound transducer if the reference impedance curve of the first reference sound transducer is more similar to the measured impedance over frequency of the actually used sound transducer in a low frequency range when compared to the reference impedance curve of the second reference sound transducer. In contrast, higher frequency equalization parameters of the second reference sound transducer can be selectively weighted stronger in the combination if the reference impedance curve of the second reference sound transducer is more similar to the measured impedance over frequency of the actually used sound transducer when compared to the reference impedance curve of the first sound transducer, and so on.

Accordingly, it can be seen that the equalization parameter determinator may efficiently combine equalization parameters of multiple reference sound transducers, to obtain the set 312 of equalization parameters, if there is no sufficiently good match between the reference impedance curve of a single reference sound transducer and the measured impedance over frequency of the currently used sound transducer.

To further conclude, there are multiple options how the equalization parameter determinator 310 can efficiently obtain a set 312 of equalization parameters on the basis of the measured information describing an impedance of a currently used sound transducer over frequency. Particularly good results can be obtained if an impedance of the actually used sound transducer is considered over a significant frequency range (e.g., for a plurality of different frequencies), wherein it is advisable to consider the impedance for at least five or at least ten frequencies.

4. Apparatus for Processing an Audio Signal According to FIG. 5

Figure 5:
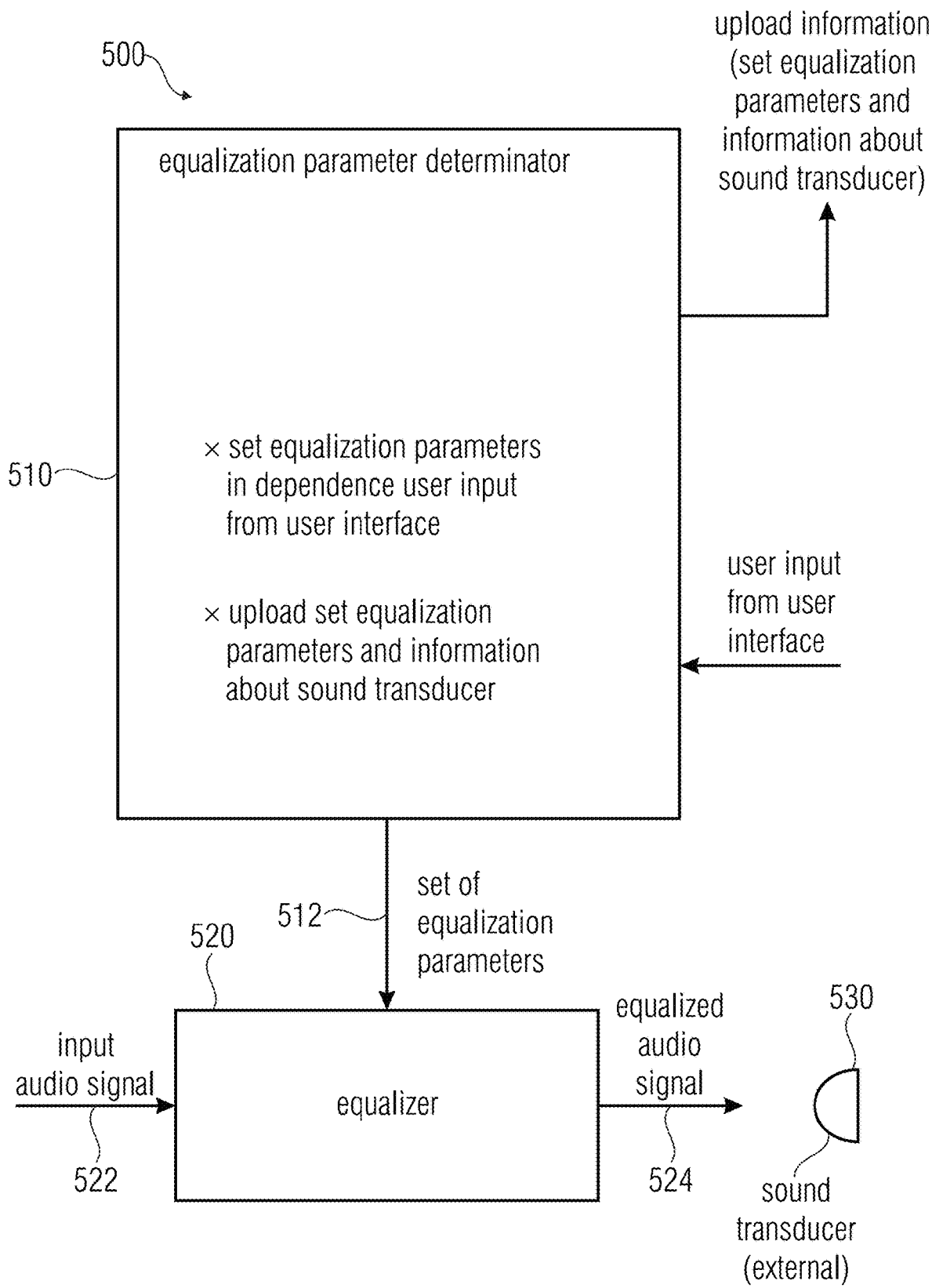
FIG. 5 shows a block schematic diagram of an apparatus for processing an audio signal for reproduction by a sound transducer, according to a fourth embodiment of the invention.

FIG. 5 shows a schematic representation of an apparatus for processing an audio signal for reproduction by a sound transducer. The apparatus according to FIG. 5 is designated in its entirety with 500. The apparatus 500 comprises an equalization parameter determinator 510 for determining a set 512 of equalization parameters. The apparatus 500 also comprises an equalizer 520 configured to equalize an input audio signal 522, to obtain an equalized audio signal 524.

The equalization parameter determinator 510 is configured to set the equalization parameter 512 in dependence on a user input from a user interface. The equalization parameter determinator 510 is also configured to upload the set 512 of equalization parameters and an information about the sound transducer 530 (which is typically external of the apparatus 500) to a global equalization parameter database, which is accessible by multiple apparatuses for processing an audio signal of multiple users.

Accordingly, the equalization parameter determinator 510 allows a user to set the equalization parameters of the set 512 of equalization parameters according to his hearing impression. Thus, at least an experienced user may be able to determine an appropriate set of equalization parameters which allows for a satisfactory hearing impression. Moreover, the user who has set the equalization parameters using the user interface will be able to share the equalization parameters with other users by uploading the information about the set of equalization parameters in combination with an information about the sound transducer to a so-called "global" equalization parameter database, which is typically accessible by multiple apparatuses of multiple users. Advantageously, the user interface will allow the user to set up the equalization parameters (for example, to define a filter curve over frequency) and to also input an information about the sound transducer (for example, a model number of the sound transducer, or the like). Thus, a meaningful information can be uploaded to the "global" equalization parameter database.

Further details regarding the user interface and also regarding the global filter parameter database will be described below.

5. System According to FIG. 6

Figure 6:
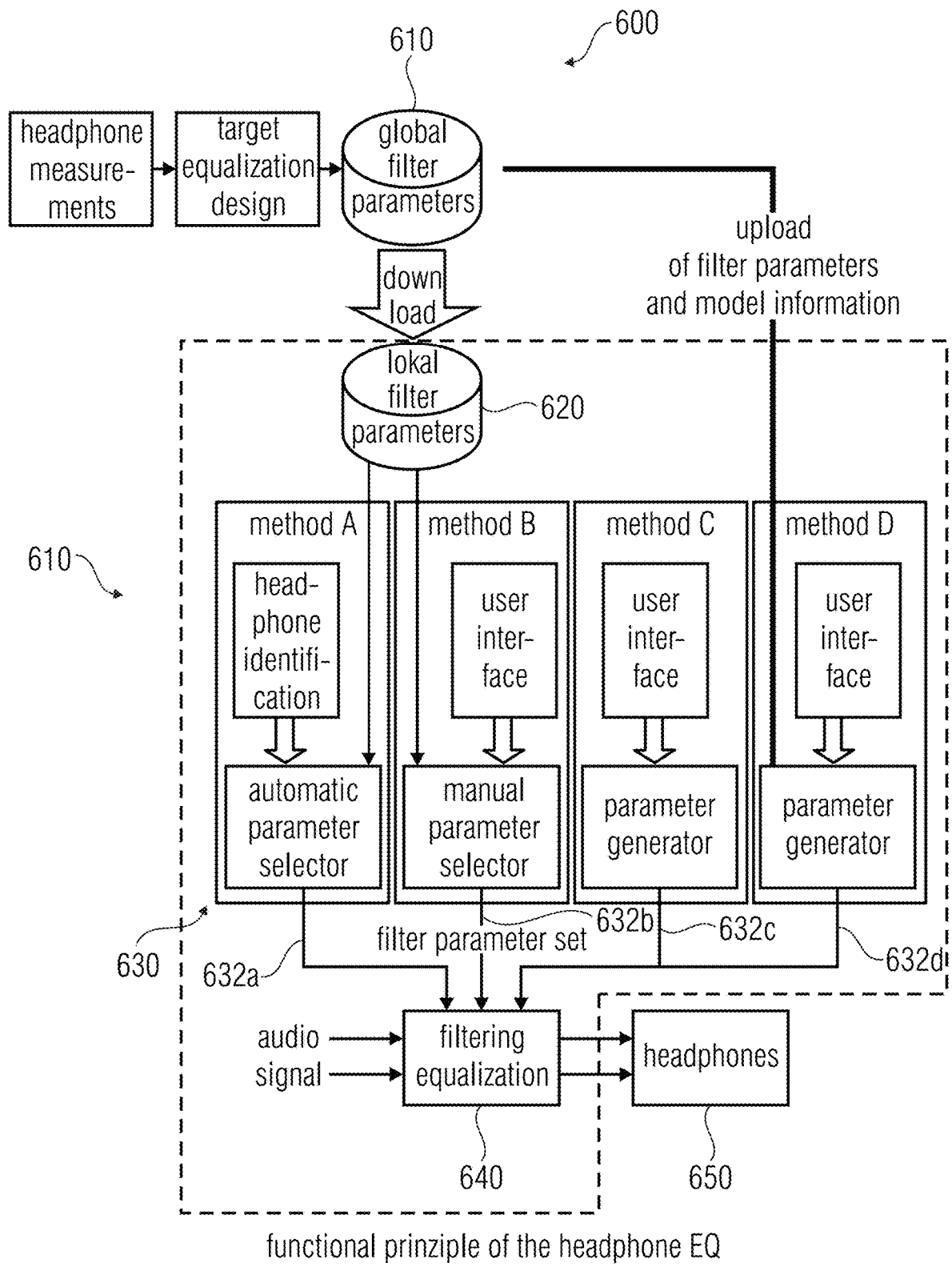
FIG. 6 shows a schematic representation of a system for a sound transducer equalization, according to an embodiment of the invention.

FIG. 6 shows a schematic representation of a system for headphone equalization. The system according to FIG. 6 is designated in its entirety with 600. It comprises a global filter parameter database 610, which may, for example, be arranged in a central server. The system 600 also comprises a user device 610 which may, for example, comprise a local filter parameter database 620, an equalization parameter determinator 630 and a filtering and/or equalizer 640.

Headphones 650 (or another type of sound transducer) may be connected to the user device 610, to receive an audio signal provided using the equalizer 640.

The global filter parameter database 610 may, for example, store a plurality of reference impedance curves of the reference sound transducers and associated equalization parameters. The equalization parameters stored in the global filter parameter database 610 may, for example, be based on headphone measurements (or, generally, sound transducer measurements) of the reference headphones (or, generally, reference sound transducers), and a target equalization design, during which the equalization parameters are derived from the measured acoustical frequency response of the respective headphones. In other words, the equalization parameters stored in the global filter parameter database 610 may be appropriate to compensate for the imperfect acoustical frequency responses of the reference headphones. However, the global filter parameter database 610 may define an association between reference headphone types and corresponding sets of equalization parameters. However, alternatively or in addition, the global filter parameter database may define an association between a set of equalization parameters and reference impedance curves over frequency of the reference sound transducers. In other words, the database may define which set of equalization parameters belongs to a headset having a specific reference impedance curve over frequency.

User device 610 may optionally (but not necessarily) comprise a local filter parameter database 620. In particular, the user device may be able to download a part of the content of the global filter parameter database 610 (or the entire content of the global filter parameter database 610). However, the information from the global filter parameter database 610 may be downloaded to the local filter parameter database 620 in advance, or upon a specific request (for example, when an unknown headphone is plugged into the user apparatus 610).

The user apparatus 610 is further configured to use one or more out of four methods (designated "method A" to "method D") to obtain an appropriate set of filter parameters (or, generally, of equalization parameters) for the filtering/equalization 640.

According to a first method ("method A"), the filter parameter determinator (or equalization parameter determinator) of the user apparatus 610 performs an automatic headphone identification. Accordingly, an automatic parameter selection may be performed (for example, using an automatic parameter selector). In other words, according to method A, the apparatus 610 (or the equalization parameter determinator 630 thereof) may automatically identify a headphone and may retrieve, from the local filter parameter database 620 or from the global filter parameter database 610, an appropriate set 632a of filter parameters (or of equalization parameters) for the filtering/equalization 640. For example, according to method A, the functionality of the equalization parameter determinator 110 and/or 210 and/or 310, as described with reference to FIG. 1, FIG. 2 and/or FIG. 3, may be used in the equalization parameter determinator 630 of the user device 610. Thus, the equalization parameter set 632a may correspond to the set 112, 212, 312 of equalization parameters. The local filter parameter database 620 may, in this case, store the reference input information that may be used by the equalization parameter determinators 110, 210, 310.

However, the equalization parameter determinator 630 of the user device 610 may, alternatively or in addition, use a second method ("method B") for the selection of the filter parameter set 632b for usage by the filtering/equalization 640. According to the second method, a user interface is provided for a manual selection of a type of a sound transducer. Accordingly, the user manually selects a model number, a model identifier or the like, of the headphone (or the sound transducer) attached to the user device. The user may either directly enter the model number or model identifier, or may choose the model number or model identifier from a list, which may be provided, for example, on the basis of the entries of the local filter parameter database 620. When the user has input a model number or model identifier, the local filter parameter database 620 may be queried to output a set of equalization parameters associated with a sound transducer of the user specified model number or model identifier. Alternatively, or in addition, the global filter parameter database 610 may be queried (for example, via a network connection) for a set of equalization parameters associated with the model number or the model identifier specified by the user. Accordingly, the filter parameter set 632b (or set of equalization parameters) may be provided on the basis of a manual selection of the type of sound transducer, and on the basis of a query of the local filter parameter database 620 and/or of the global filter parameter database 610.

Alternatively, or in addition, a third concept ("method C") may be implemented in the user apparatus 610, or in the equalization parameter determinator 630 thereof, to provide a filter parameter set for the filtering/equalization 640. According to the third concept ("method C"), a user interface may be provided in combination with a parameter generator, to provide a filter parameter set 632c. The parameter generator, which is used according to the third concept, may provide a filter parameter set 632c on the basis of a user input. For example, a user may adjust parameters of a multi-band equalizer using the user interface.

Alternatively, or in addition, a fourth concept ("method D") may be used for providing the set of filter parameters. According to the fourth concept, a set 632d of filter parameters may be obtained on the basis of an input from a user interface. For this purpose, a parameter generator may be used. However, in addition to the user's input which determines the values of the filter parameter set 632d (or a set of equalization parameters 632d) some information characterizing the headphones (or sound transducer) 650 connected to a user device 610 may be received from the user interface. For example, a model name or other model identifier of the headphone 650 may be input via the user interface according to concept 4 ("method D"). Accordingly, the equalization parameter determinator 630 of the user device 610 may be configured to upload an information comprising a filter parameter set (or, generally, a set of equalization parameters) and a model identifier identifying the currently used headphones 650 to the global filter parameter database 610 when the user has provided information via the user interface which results in a "sufficiently good" filter parameter set, which, according to the user's assessment, results in an acceptable or sufficiently good audio quality of the audio signal presented by the headphones 650. In other words, the user interface may provide a possibility to the user to adjust (and/or tune) the filter parameter set 632d until the audio quality of the audio signal presented to the user by the headphones 650 fulfills the user's expectations, and to confirm that the audio quality of the audio signal equalized using the currently selected (or adjusted) filter parameter set 632d fulfills his expectations. In response to the user's input, via the user interface, indicating that the audio quality of the audio content provided by the headphones 650 using the currently selected (or adjusted) filter parameter set 632d is sufficiently good, the equalization parameter determinator 630 may upload a combination of the currently used filter parameter set, which was approved by the user, and a model identifier of the currently used headphones 650 to the global filter parameter database 610. Accordingly, the global filter parameter database 610 may store an association between a model identifier of the currently used headphones 650 and a currently used filter parameter set 632d (which, according to the user's assessment and confirmation, results in a sufficiently good audio quality), such that other users (or user devices, which may be substantially identical to the user device 610) can profit from the current user's efforts to find a reasonably good filter parameter set 632d. Thus, the filter parameter set 632d, which has been identified on the basis of a manual adjustment of the filter parameter set via the user interface, can subsequently be used, by other user devices in an automatic or semi-automatic filter parameter set selection (which may, for example, be performed according to the first concept ("method A") or second concept ("method B").

Accordingly, the system 600 allows for a selection of filter parameter sets (or, generally, a set of equalization parameters) using different approaches. An automatic parameter selection (using an automatic parameter selector in combination with an automatic headphone identification), a manual parameter selection (using a manual parameter selector in combination with a user interface), a manual parameter generation without feedback (using a parameter generator and a user interface) and a manual parameter generation with feedback (using a parameter generator and a user interface, as well as a feedback) can be used. Manually generated filter parameter sets can be fed back to a global filter parameter database, and can be downloaded from said global filter parameter database subsequently, to reuse the efforts of the manual parameter generation. Accordingly, a sufficiently good filter parameter set can be obtained with reasonably small effort in many circumstances.

Figure 7:
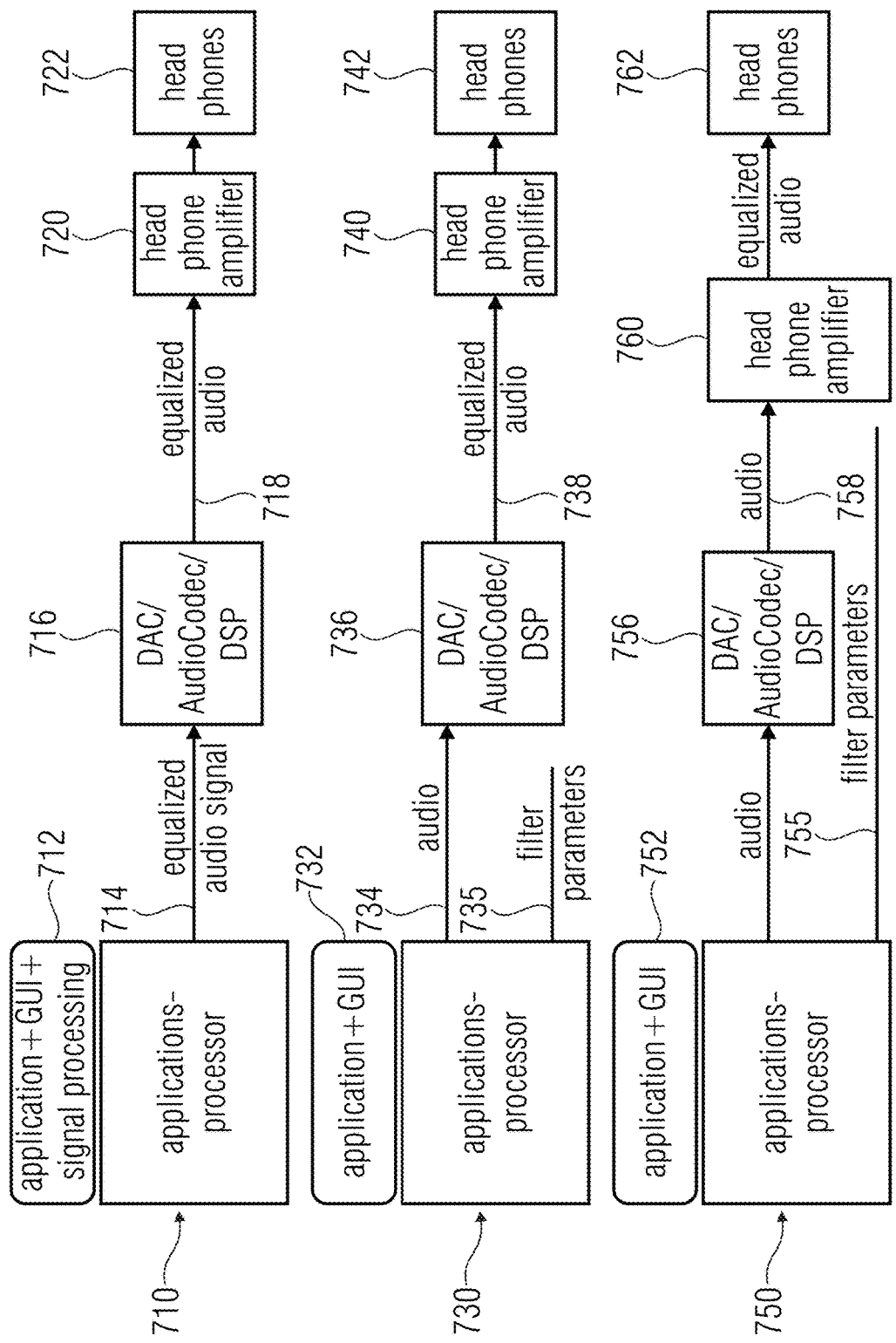
FIG. 7 shows a schematic representation of different approaches to apply a sound transducer equalization (for example, a headphone equalization)
Figure 8:
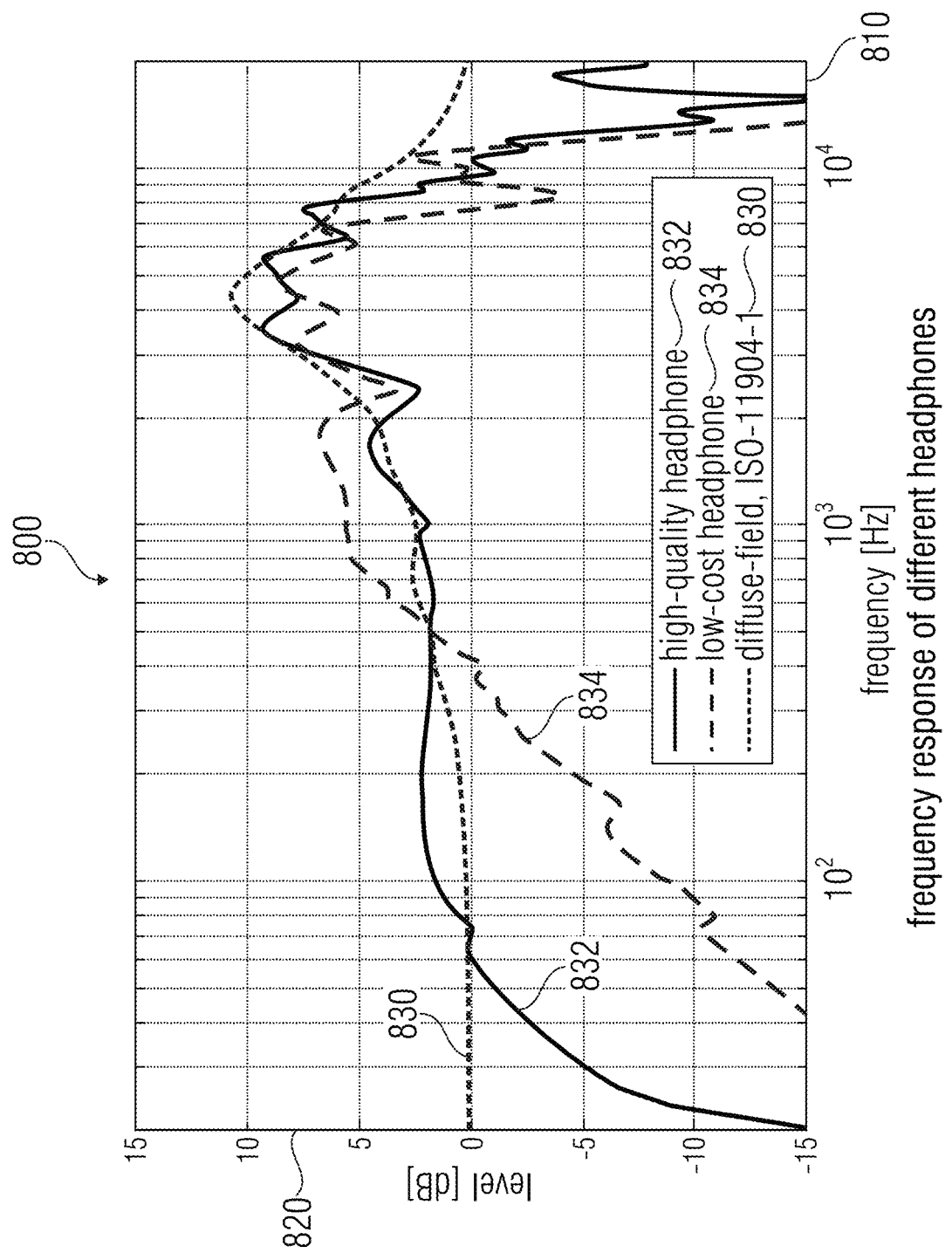
FIG. 8 shows a graphic representation of frequency responses of different headphones.
Figure 9:
FIG. 9 shows a screenshot of a so-called "Life Vibes" sound enhancement for headphones.
Figure 10:
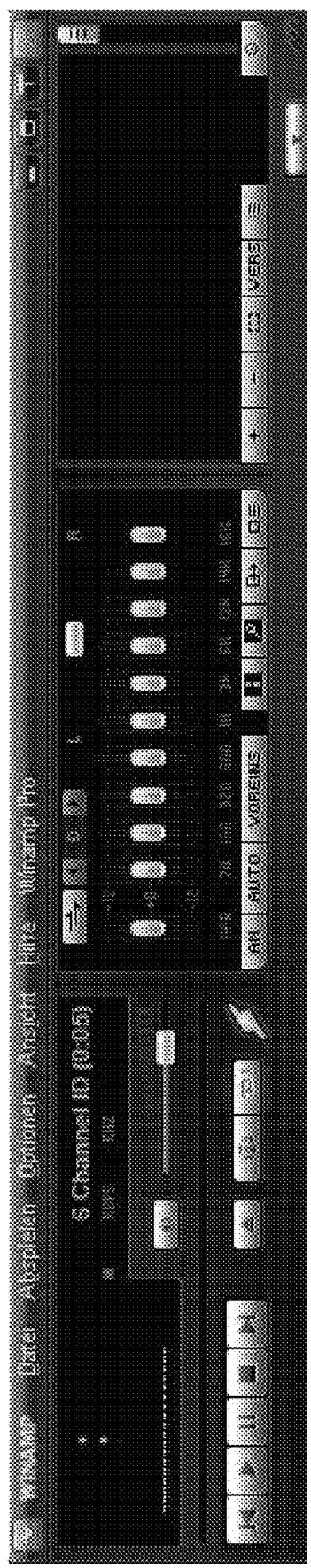
FIG. 10 shows a screenshot of a ten-band equalization in a so-called "Winamp" media player.
Figure 11:
FIG. 11 shows a screenshot of a so-called "Engage" algorithm with headphone selection.
Figure 12:
FIG. 12 shows a graphic representation of a "Nubert" ATM device.
Figure 13:
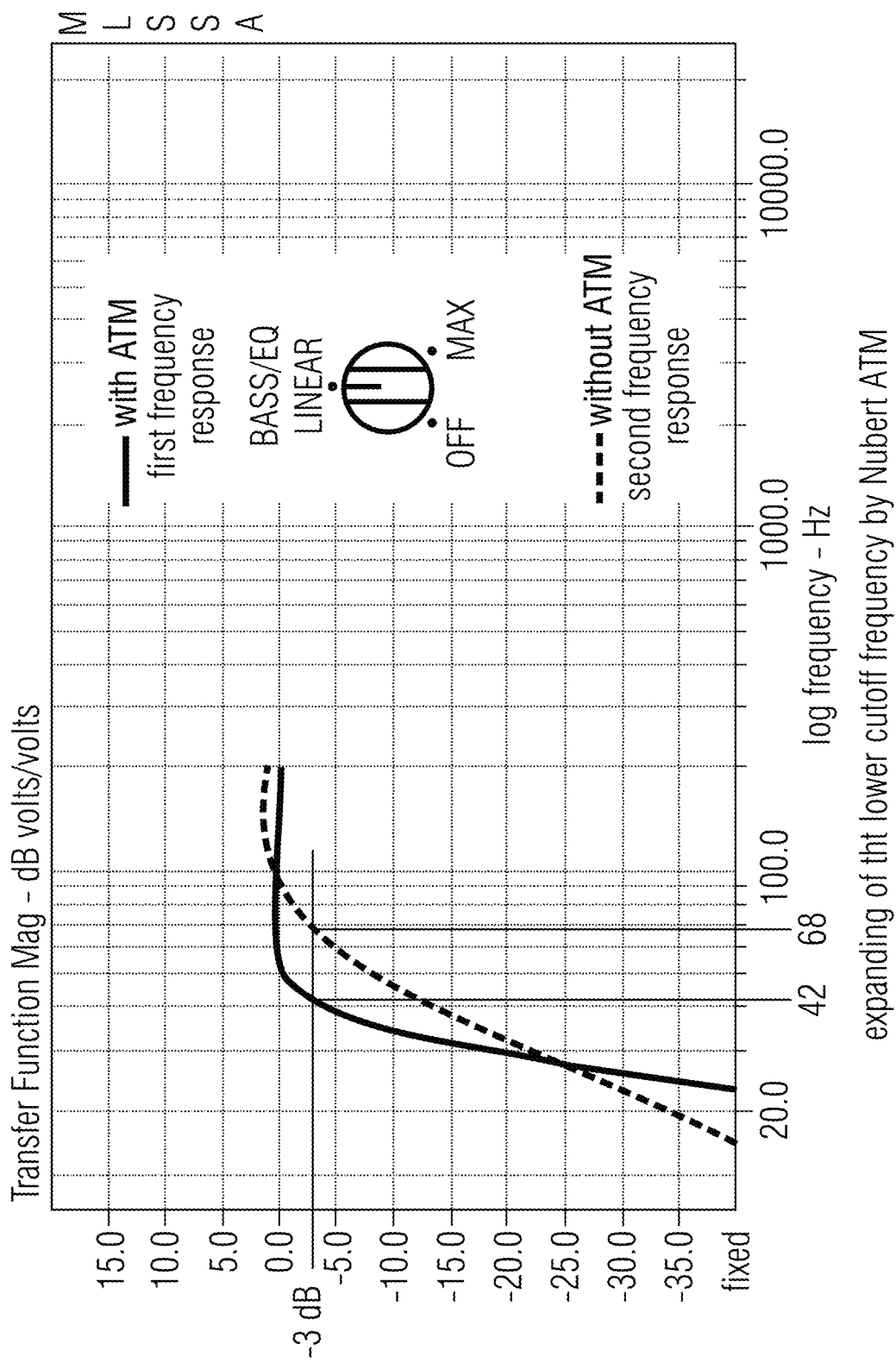
FIG. 13 shows a graphic representation of a lower cut-off frequency by the "Nubert" ATM.

FIG. 7 shows block schematic diagrams which describe different approaches for applying the headphone equalization (for example, defined by the respectively determined filter parameter sets 632a, 632b, 632c, 632d, or the set of equalization parameters determined by one of the apparatuses 100, 200, 300, 500).

In a first embodiment, which is shown at reference numeral 710, the headphone equalization may be applied at a very high level, for example at an application level. In other words, there may be a computer program which combines the actual application, the graphical user interface and the signal processing, wherein the signal processing, which is performed by this computer program 712, includes the sound transducer equalization (headphone equalization). The computer program 712 is executed, for example, by an applications processor, which may be a main microprocessor of a computer system or of a smart-phone. Accordingly, an equalized audio signal (wherein the headphone equalization is already applied) 714 is output to a further dedicated signal processing 716 which may comprise a combination of a digital-to-analog converter, an audio codec and a digital signal processor. Accordingly, the dedicated audio signal processing 716 provides, as an output signal, an equalized audio signal 718, which may be an analog signal, to a headphone amplifier 720. The headphone amplifier amplifies the equalized (typically analog) audio signal 718 and provides an amplified audio signal to the headphones 722. To summarize, the actual headphone equalization may be performed at a very high level, namely at the level of the application program, using the applications processor.

According to a second implementation, which is shown at reference numeral 730, the program 732 comprising the application and the graphical user interface does not perform the headphone equalization. In other words, the headphone equalization is not performed by the applications processor (for example, main processor) according to this implementation alternative. Rather, the applications processor provides the non-headphone-equalized audio signal 734 and a set of filter parameters or equalization parameters 735 to the dedicated audio signal processing 736, which may comprise a digital-to-analog converter, an audio codec and a digital signal processor. Thus, the digital signal processor of the dedicated audio processing 736 may apply the headphone equalization, and consequently provides an equalized (typically analog) audio signal 738 to the headphone amplifier 740. The headphone amplifier 740 amplifies the equalized audio signal 738 and provides the amplified audio signal to the headphones 742.

According to a third implementation alternative, which is shown at reference numeral 750, the headphone equalization is applied only at the headphone amplifier. In other words, a computer program 752, which implements the application and the graphical user interface, and which is executed by an applications processor, does not perform the headphone equalization. Rather, the applications processor provides a non-headphone-equalized audio signal to the dedicated audio processing 756. Also, the applications processor provides an information 755 describing the filter parameters directly to the headphone amplifier 760. The dedicated audio signal processing 756 provides a typically analog audio signal 758 to the headphone amplifier 760, wherein a typically analog equalization is performed by the headphone amplifier 760 and is adjusted on the basis of the information 755 describing the filter parameters. Accordingly, the headphone amplifier 760 performs the actual headphone equalization and consequently provides an equalized amplified audio signal to the headphones 762.

In the following, the overall concept underlying embodiments according to the present invention will be shortly summarized.

Firstly, an overview over some of the main ideas of embodiments of the present invention will be provided. One of the main ideas of the present invention is that specific filters or filter parameters can be downloaded to or selected on a device that is designed for headphone playbacks (as shown in FIG. 6, which shows a functional principle of a headphone equalization). A user can download and install a headphone-specific processing functionality to a device.

The filters can be implemented as analog or digital filters. This headphone equalization improves the perceived audio quality of the connected headphones. The technology can be used for any kind of headphones. It is not bound to one specific headphone type or brand.

Some of the main ideas are:
To apply headphone equalization filters that match a specific pair of headphones;
These filter parameters can be transmitted to a playback device (for example, through the internet);
Other filter parameters for other headphones can be selected or downloaded afterwards; and
If no filter parameters for a specific headphone are available, a user-friendly parameter generator on the device can be used. It generates a filter that fits best to this headphone (providing optimal audio quality).

In the following, the generation of global filter parameters will be described.

As mentioned in the introduction when discussing filters for headphones, the filter parameters of the headphone equalization are advantageously derived from the frequency responses of the headphones. Hence, the frequency responses of the headphones should be known. Typically, this is done by measurements with artificial ears or acoustical couplers.

Now, a target frequency response (the desired frequency behavior) should be designed. In theory, the target response can be of any shape. It is even possible to design more than one target equalization curve. For higher audio quality, target responses could follow an equalization curve similar to a so-called "diffuse field".

Combining the measured frequency response and the target equalization curve, the filter parameters (of an equalization filter) can be calculated (see, for example, reference [5]). The filter parameters of all supported/measured headphones may be stored in a database (not necessarily on the playback device or user device) and are therefore referred to as global filter parameter (GFP). For example, reference is made to FIG. 6.

Because of the high requirements, the headphone measurement, the target equalization design and the calculation are typically done by the provider of this technology advance.

In the following, the transmission of filter parameters to and from the device (for example, a user device like a personal computer, a music player or multimedia player, or a smart-phone) will be described.

In some embodiments, the filter parameters are stored on the playback device, too, referred to as local filter parameters (LFP). The local filter parameters do not have to contain all headphones of the global filter parameter (GFP) database. It can be a subset of the global filter parameters due to several reasons like:
Memory consumption issues;
Outdated headphone models;
A provider only wants to support only a set of his choice;
Proprietary business models of technology.
An application containing the local filter parameter set or the local filter parameters themselves are transmitted from a GLP-server to the playback device, e.g. by internet or a mobile connection.

The local filter parameter set can be extended afterwards by using the download capability of the technology. An extension of the local filter parameter set is may be used if the user connects a headphone that does not match the local filter parameter-set but is available in the global filter parameters database. Furthermore, local filter parameter sets can be uploaded from the device to the global filter parameters together with information on the headphone type or model.

In the following, the selection of the headphone equalization will be described.

At the playback device, the local filter parameter has to be selected that fits to the currently connected headphones. There are different methods of selecting the correct local filter parameter (see FIG. 6).

Method A: Automatic Headphone Identification

For this method, the user does not need to know details of headphones attached to the device. An application is used to identify the specific headphone model to choose the right local filter parameter.

Implementations of this method could be:

A specific headphone identifier (ID) can be encoded on the headphone (for example, using a chip in the headphone) and can be transferred to the application for example, via a radio frequency transmission, by a signal outside audio bandwidth (advantageously greater than 20 kHz), using sophisticated circuitry at the headphone amplifier, receiving a ID sequence from the headphone or signaling embedded data in the audio stream, or by optical means (for example, barcode);

An image recognition application may use additional information to identify the headphone, for example the camera by scanning the headphone or an optical code; and/or Detection of headphone, matching of the electrical impedance-over-frequency curve to a specific headphone (or at least a specific headphone class).

In the following, some details regarding the detection of a headphone using the electrical impedance-over-frequency curve will be described. This concept is based on some findings which are disclosed in reference [11]. The electrical impedance-over-frequency curve can be measured using current developed devices like amplifiers which can perform current sensing to e.g. prevent speaker damage (see, for example, reference [12]). After plugging in new headphones to the device (for example a user device 630), a measurement process can be performed while voltage and current are recorded to calculate complex impedance over frequency. The impedance curves of different types of headphones show distinctive differences and features. For example, reference is made to the right side of FIG. 4a, which shows an example of acoustical impedance (left) versus electrical impedance (right) responses for two different types of headphones, for an example of an intra-concha type (upper plot) and a circum-aural type (lower plot). Also, reference is made to the table of FIG. 4b, which shows differences in the impedance response of two different types of headphones.

To finally find the filter which matches best the frequency response of the currently plugged-in headphones (as an example, see the left side of FIG. 4a), one of the two following approaches or a combination is used with the help of a database. This database is, for example, a table with two columns: electrical complex impedance curves (typically represented by a plurality of complex impedance values for a plurality of different frequencies) on one side and the corresponding fitting headphone filters on the other side.

As briefly mentioned, it is desired that the filters are created from acoustical measurements, which, however, typically cannot be done by the end user.

Approach A: Table Lookup Identification

An error algorithm (for example, least-mean-square) compares the electrical impedance curve over frequency (magnitude and phase) to previously measured electrical impedance curves stored in a database. If the error algorithm is successful matching the currently measured curve to one of the database, the plugged-in headphones are identified and the fitting filters can be loaded.

Approach B: Filter Generation

If Approach A is not possible or successful, a fitting filter may be generated. Unlike in Approach A, an algorithm (for example, principal-component-analysis, PCA-analysis) is performed on multiple previously measured electrical-impedance curves in the list. By using the most distinctive features of the electrical impedance response of the current measured headphone, the fitting features of different filters for multiple headphones may be combined to a corresponding filter (or corresponding filters) in a frequency domain fitting for the specific headphone currently measured.

Method B: Manual Selection by User (List of Headphones)

A user can choose his/her specific headphones from a list.

Method C: Parameter Generator

This is a fallback solution if no matching LFP/GFP is available for the selected headphone type:

Parameters for filters are gained by analyzing GFP and extracting the most important contributes (for example, by means of Cluster Analysis or Principle Component Analysis);

User has to adapt the filters to his headphone by either choosing a generic type of headphone (for example, big/small) or by changing the filter continuously while playback and thereby adjusting the right setting by perception;

Based on the parameter settings (adjusted by a user) a complex filter function is created taking the most important headphone attributes into account;

For an easier selection, the user interface should allow an A-B comparison to compare between different filter sets and/or the selected filter set and no processing (bypass).

Method D: Parameter Generator with Upload Functionality

This method works is an extension of Method D. It allows the user-selected parameters to be uploaded to the database together with information on the type or model used by the user. This allows an extension of the database to headphone models unknown by the database and/or refinement of the parameters based on user opinion.

To summarize, one or more of the above functionalities can be performed by the equalization parameter determinators 110. 210. 310. 510, 630 described herein, wherein the filter parameter set may take the role of the set of equalization parameters. For example, some or all of the functionalities described above may be implemented in the apparatuses according to FIGS. 1, 2, 3 and 5 or in the system described with reference to FIG. 6.

In the following, the question will be discussed where the filtering happens. It should be noted that there are at least three different solutions where to apply the headphone equalization filtering. For details, reference is made, for example, to FIG. 7.

Method 1: Application Processor

In an implementation, the audio processing (filtering/equalization) can be performed by a pre-installed software or the audio processing is performed by an application that can read and apply the filter parameters, for example, the equalizer of a music player (or music player software).

Method 2: Audio Processor (Audio Codec/DAC/DSP)

In some implementations, audio processors have some capabilities to apply digital or analog filters. They can be controlled by the application. The filter parameters can be converted to best use the filters available in the audio processor.

Method 3: Headphone Amplifier

In some implementations, an analog audio signal is fed into the headphone amplifier device that is equipped with the proposed headphone equalization. Headphone equalization (or equalizer) is applied on that signal. Hence, this device can be connected to any device that outputs an analog audio signal.

For further details, reference is made to FIG. 7 and the description above.

CONCLUSIONS

Embodiments according to the invention may bring along one or more of the following effects or specific improvements:

The most important advantage for the user is an improved sound quality, due to better frequency response of the headphone (as deficiencies of the headphones are compensated);

The user does not have to spend much money for expensive headphones in order to achieve good audio quality;

Easy to use: the user does not have to go into details (like setting parameters of an equalization) or measure frequency responses of the headphone. Just selecting the headphones is enough in some embodiments;

For the manufacturer of headphones, it may be an advantage that they can differentiate by providing filter parameter sets for download or pre-installed on devices;

The audio quality of cheap (and not ideal) headphones can be improved. Hence, vendors of playback devices that come along with headphones can save money. Instead of more expensive headphones, cheap ones—supported by the described solution—are able to deliver same or even better quality;

Device manufacturers can improve the sound quality by providing a user controlled or automatic headphone identification;

Multimedia software vendors can develop applications that include headphone equalization for the audio signals;

Flexibility: by downloading new filter parameters, the device is not bound to a specific pair of headphones. Hence, it is even possible to support future headphones.

In some embodiments, a large database is stored locally allowing selection without connection to an external database. In other words, information of the global filter parameter database 610 described above can be stored in the local filter parameter database 620.

Moreover, it should be noted that in some implementations according to the present invention, there is a list of headphone models in an application that generates a different output at the headphone output of a device. In some implementations, information has to be downloaded from an external source depending on the model or type.

Moreover, it should be noted that embodiments according to the present invention can be applied in different technical application areas:
Smart-phones
Personal music players
Tablet devices
Blu-ray/DVD/CD-players
A/V receivers;
TV sets;
In-car/in-flight entertainment systems;
Professional audio;
Sound cards;
Headphone amplifiers.

To summarize, embodiments according to the invention allow to improve the perceived audio quality of headphones. The better sound quality is based on filters that are especially designed for headphones. The filters and/or filter parameters can be received by a web-based download.

Embodiments according to the invention overcome the problem to adjust the filters to match the specific headphones attached.

Moreover, embodiments according to the invention overcome the disadvantage that a filter adjustment (i.e., equalization) is typically not done by the manufacturer of a consumer media device, although the sound quality could be greatly improved, as the headphone connected is conventionally unknown in most cases.

Embodiments according to the invention allow for the future downloading of new headphone filters in many applications.

Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

[1] Møller, H.; Jensen, C.; Hammershøi, D. & Sorensen, M. Design Criteria for Headphones J. Audio Eng. Soc, 1995, 43, 218-232

[2] Lorho, Gaëtan: Subjective Evaluation of Headphone Target Frequency Respon-es. In: Audio Engineering Society Convention 126 #7770. Munich, Germany, May 2009

[3] Bestimmung der Schallimmission von ohrnahen Schallquellen Teil 1: Verfahren mit Mikrofonen in menschlichen Ohren (MIRE-Verfahren), DIN EN ISO 11904-1, Deutsches Institut für Normung e.V., February 2003

[4] Akustik-Simulatoren des menschlichen Kopfes und Ohres-Teil 1: Ohrsimulator zur Kalibrierung von supraauralen und circumauralen Kopfhörern (IEC 60318-1: 2009); Deutsche Fassung EN 60318-1:2009, Deutsches Institut für Normung e.V., July 2010

[5] Fleischmann, Silzle, Plogsties: Headphone Equalization—Measurement, Design and Psychoacoustic Evaluation, Microelectronic Systems, Springer Verlag 2011, Pages 301-312

[6] US Patent US 2009/0095804 A1

[7] U.S. Pat. No. 8,014,539, "Method and apparatus to control output power of a digital power amplifier . . . ", Young-suk Song et al.

[8] TC Electronic System 6000; Engage algorithm; http://www.tcelectronic.com/media/Sys6_MKII_algorithms.pdf

[9] HTC Sensation, http://www.htc.com/de/smartphones/htc-sensation-xl/#overview

[10] Nubert ATM, http://www.nubert.de/index.php?id=111

[11] Windows Platform Design Notes—Analog Audio Classification Using Device Impedance Characteristics, Version 1.0—Apr. 16, 2002

[12] http://www.nxp.com/products/amplifiers/audio_amplifiers/amplifiers_for_portable_devices/TFA 9887UK.html

The invention claimed is:

1. A system, comprising:
a global equalization database, which defines an association between a plurality of different models of sound transducers, which are external headphones or external headsets, and corresponding sets of equalization parameters and which is accessible by multiple apparatuses for processing an audio signal of multiple users, such that it is possible to share an equalization parameter setting identified by a user with other users;
an apparatus for processing an audio signal for reproduction by a sound transducer, the apparatus comprising:
a user interface;
an equalization parameter determinator for determining a set of equalization parameters; and
an equalizer configured to equalize an input audio signal, to acquire an equalized audio signal;
wherein the equalization parameter determinator is configured to set the equalization parameters in dependence on a user input from the user interface of the apparatus; and
wherein the equalization parameter determinator is configured to upload the set of equalization parameters and a model identifier of the sound transducer, which is an external headphone or an external headset connected to the apparatus, to the global equalization database, which is accessible by multiple apparatuses for processing an audio signal of multiple users, such that it is possible to share an equalization parameter setting identified by a user with other users.

2. The system according to claim 1, wherein the equalization parameter determinator further comprises a sound transducer identification configured to identify a model of a sound transducer and a parameter selection configured to select a set of equalization parameters based on the identification of the model of the sound transducer;
wherein the apparatus is configured to download one or more sets of equalization parameters associated with the identified model of the sound transducer from the global equalization database; and
wherein the sound transducer identification is configured to take into account the one or more downloaded sets of equalization parameters associated with the identified model of the sound transducer.

3. The system according to claim 1, wherein the system further includes at least another apparatus that performs an automatic or semi-automatic equalization parameter set selection, in which a model of an external sound transducer is identified automatically or manually using a user interface, and in which a set of equalization parameters associated with the identified model of external sound transducer is retrieved from the global equalization parameter database.

4. A method for processing an audio signal for reproduction by a sound transducer, the method comprising:
determining a set of equalization parameters; and
equalizing an input audio signal, to acquire an equalized audio signal;
wherein the equalization parameters are set in dependence on a user input from a user interface; and
wherein the set of equalization parameters and a model identifier of the sound transducer, which is an external headphone or an external headset connected to an apparatus which equalizes the input audio signal and which sets the equalization parameters in dependence on a user input from a user interface, are uploaded to a global equalization parameter database, which is accessible by multiple apparatuses for processing an audio signal of multiple users, such that the global equalization parameter database stores an association between a model identifier of the sound transducer, which is an external headphone or an external headset, and a set of equalization parameters, which was approved by the user, for a plurality of different models of sound transducers; and
sharing an equalization parameter setting identified by a user with other users, wherein the set of equalization parameters is used by one or more other user devices in an automatic or semi-automatic equalization parameter set selection, in which a model of an external sound transducer is identified automatically or manually using a user interface, and in which a set of equalization parameters associated with the identified model of external sound transducer is retrieved from the global equalization parameter database for use in an equalization.

5. A non-transitory computer readable medium including a computer program for performing the method according to claim 4 when the computer program runs on a computer.

* * * * *